(12) United States Patent
Zhao et al.

(10) Patent No.: US 12,402,382 B2
(45) Date of Patent: *Aug. 26, 2025

(54) NITRIDE-BASED BIDIRECTIONAL SWITCHING DEVICE FOR BATTERY MANAGEMENT AND METHOD FOR MANUFACTURING THE SAME

(71) Applicant: INNOSCIENCE (SUZHOU) SEMICONDUCTOR CO., LTD., Suzhou (CN)

(72) Inventors: Qiyue Zhao, Suzhou (CN); Wuhao Gao, Suzhou (CN); Baoli Wei, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/777,058

(22) PCT Filed: Jan. 18, 2022

(86) PCT No.: PCT/CN2022/072558
§ 371 (c)(1),
(2) Date: May 16, 2022

(87) PCT Pub. No.: WO2023/137588
PCT Pub. Date: Jul. 27, 2023

(65) Prior Publication Data
US 2024/0204058 A1    Jun. 20, 2024

(51) Int. Cl.
H10D 62/85 (2025.01)
H03K 17/0812 (2006.01)
(Continued)

(52) U.S. Cl.
CPC ............ *H10D 62/8503* (2025.01); *H03K 17/08122* (2013.01); *H03K 17/687* (2013.01);
(Continued)

(58) Field of Classification Search
CPC ............ H01L 27/0274; H02J 7/00302; H02J 7/00306; H02J 7/0031; H02J 7/0047; H02J 7/0068; H01M 10/425; H01M 2010/4271
(Continued)

(56) References Cited

U.S. PATENT DOCUMENTS

2008/0121995 A1    5/2008   Anderson et al.
2012/0275076 A1*  11/2012   Shono .................. H03K 17/567
                                                                361/86
(Continued)

FOREIGN PATENT DOCUMENTS

CN    106486543 A    3/2017
CN    107611089 A    1/2018
(Continued)

OTHER PUBLICATIONS

Taiwan Patent Office, Office Action issued on Oct. 4, 2024 for TW application No. 113107480.
(Continued)

*Primary Examiner* — Kevin J Comber
(74) *Attorney, Agent, or Firm* — Li & Cai Intellectual Property (USA) Office

(57) ABSTRACT

A nitride-based bidirectional switching device is provided for working with a battery protection controller having a power input terminal, a discharge over-current protection (DO) terminal, a charge over-current protection (CO) terminal, a voltage monitoring (VM) terminal and a ground terminal. The nitride-based bidirectional switching device comprises a nitride-based bidirectional switching element and an adaption module configured for receiving a DO
(Continued)

signal and a CO signal from the battery protection controller and generating a main control signal for controlling the bidirectional switching element. By implementing the adaption circuit, the nitride-based bidirectional switching element can work with conventional battery protection controller for battery charging and discharging management. Therefore, a nitride-based battery management system can be realized with higher operation frequency as well as a more compact size.

18 Claims, 17 Drawing Sheets

(51) Int. Cl.
| | | |
|---|---|---|
| *H03K 17/687* | (2006.01) | |
| *H10D 30/47* | (2025.01) | |
| *H10D 84/01* | (2025.01) | |
| *H10D 84/80* | (2025.01) | |

(52) U.S. Cl.
CPC ........... *H10D 30/475* (2025.01); *H10D 84/01* (2025.01); *H10D 84/811* (2025.01)

(58) Field of Classification Search
USPC ....................................................... 361/93.1
See application file for complete search history.

(56) References Cited

U.S. PATENT DOCUMENTS

| | | | |
|---|---|---|---|
| 2014/0009189 A1 | 1/2014 | Mauder et al. | |
| 2015/0326217 A1 | 11/2015 | Barrenscheen et al. | |
| 2019/0326280 A1 | 10/2019 | Imam et al. | |
| 2021/0335781 A1* | 10/2021 | Arnold | ................. H10D 30/475 |

FOREIGN PATENT DOCUMENTS

| | | |
|---|---|---|
| CN | 109427772 A | 3/2019 |
| CN | 210093123 U | 2/2020 |
| CN | 109586553 B | 2/2021 |
| CN | 112956119 A | 6/2021 |
| CN | 113228511 A | 8/2021 |
| CN | 113690956 A | 11/2021 |
| CN | 113872428 A | 12/2021 |
| JP | 6545491 B2 | 7/2019 |
| JP | 6570486 B2 | 9/2019 |
| TW | 200640011 A | 11/2006 |
| TW | 201308647 A1 | 2/2013 |
| TW | 201803119 A | 1/2018 |
| TW | 202002238 A | 1/2020 |
| TW | 202025606 A | 7/2020 |

OTHER PUBLICATIONS

Taiwan Patent Office, Office Action issued on Nov. 1, 2024 for TW application No. 113107481.

International Search Report and Written Opinion of the corresponding PCT application No. PCT/CN2022/072558 mailed on Oct. 10, 2022.

European Patent Office, Extended European Search Report Issued in Application No. 22705004.4, Nov. 2, 2023, Germany, 8 pages.

Taiwan Patent Office, Office Action Issued in Application No. 111135112, Sep. 21, 2023, 11 pages. (Submitted with Machine Translation).

Taiwan Patent Office, Office Action Issued in Application No. 111135112, May 23, 2023, 9 pages. (Submitted with Machine Translation).

* cited by examiner

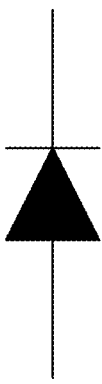
D1/D2/D3/D4/D5/D6/D7
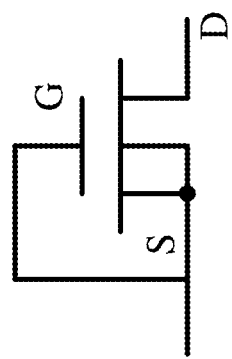
FIG. 8

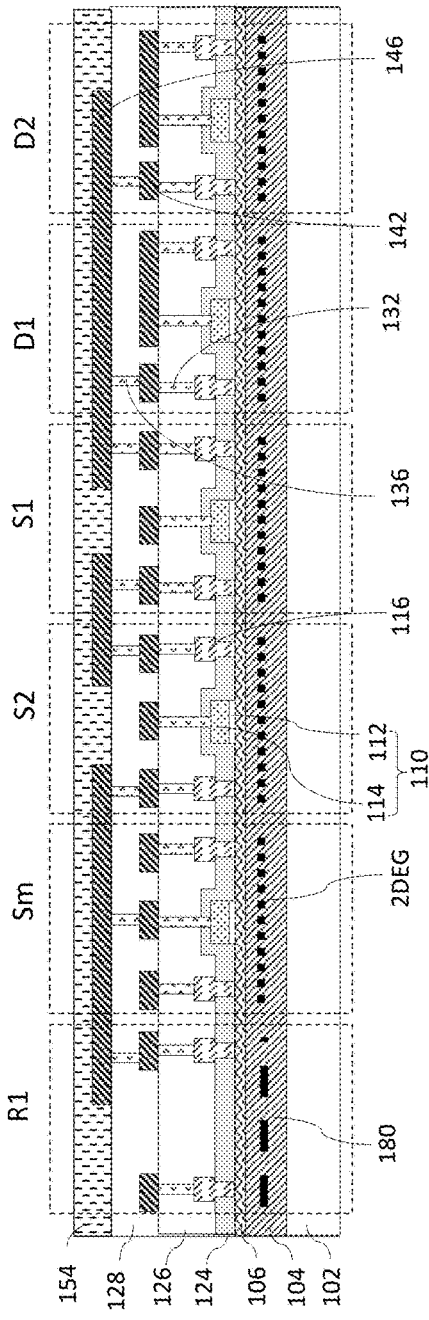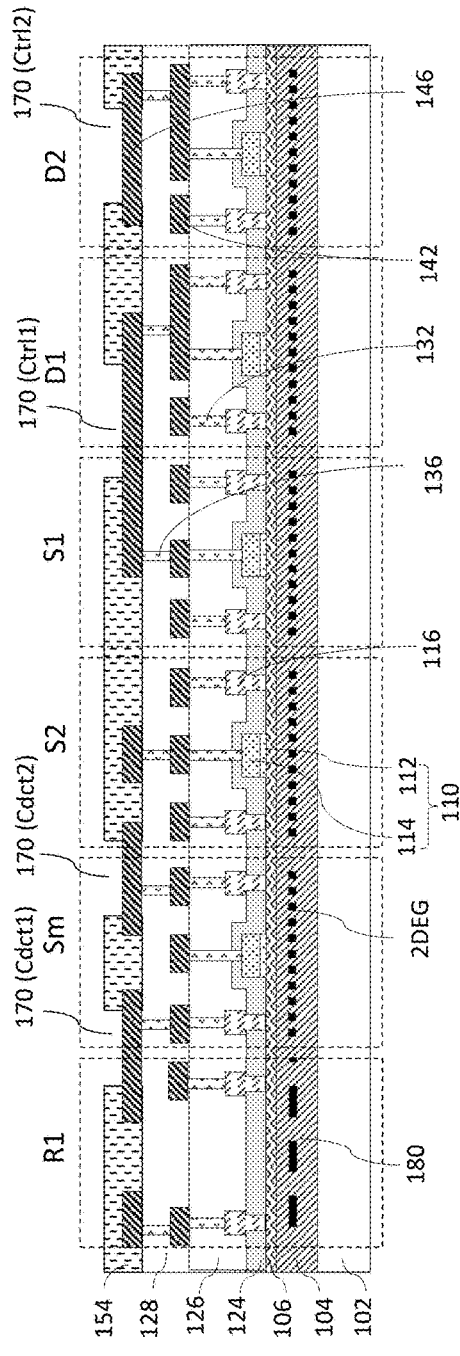
FIG. 9A
FIG. 9B

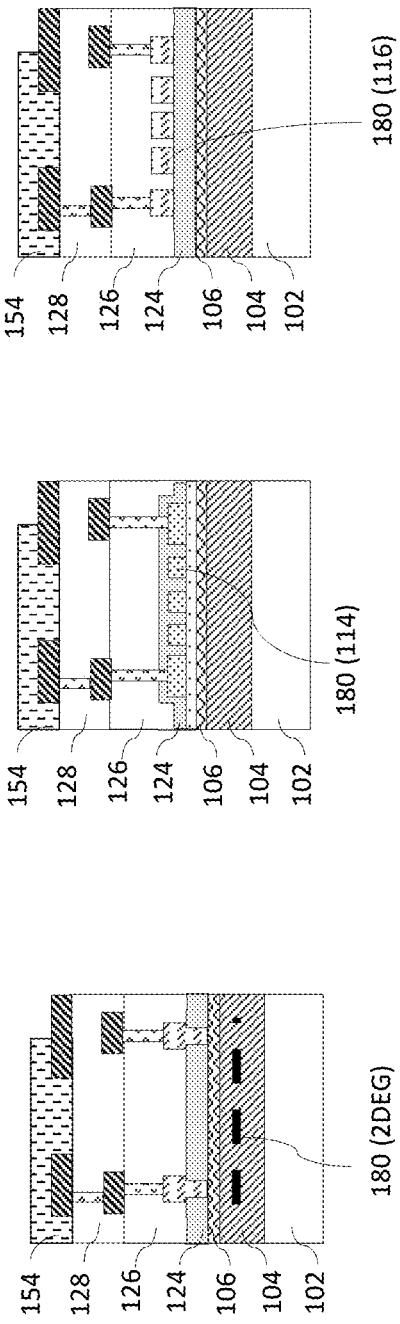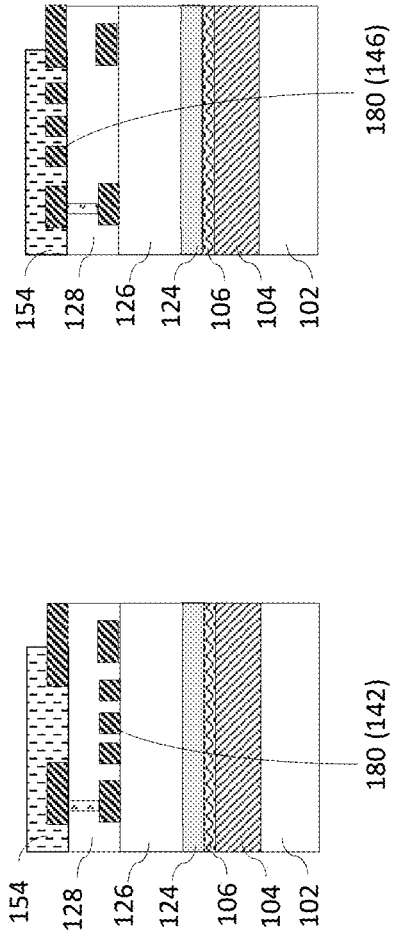

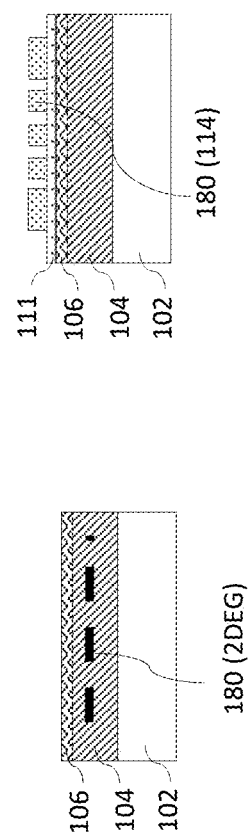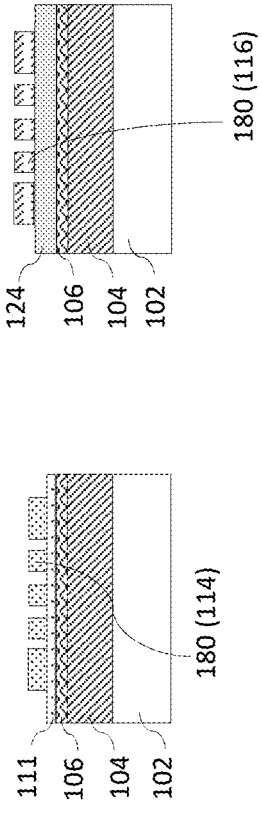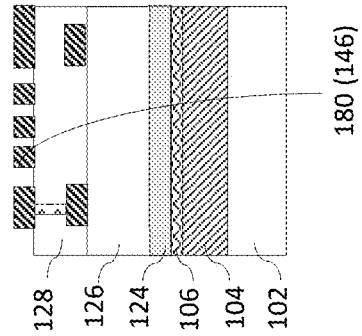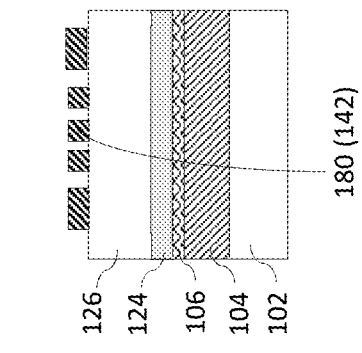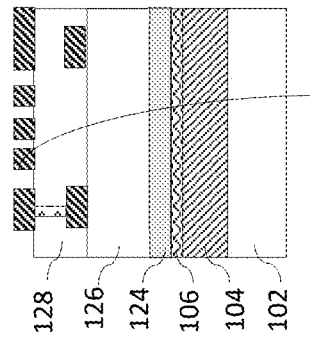

NITRIDE-BASED BIDIRECTIONAL SWITCHING DEVICE FOR BATTERY MANAGEMENT AND METHOD FOR MANUFACTURING THE SAME

FIELD OF THE INVENTION

The present invention generally relates to a nitride-based semiconductor bidirectional switching device. More specifically, the present invention relates to a nitride-based semiconductor bidirectional switching device for battery management.

BACKGROUND OF THE INVENTION

For charging and discharging of high power density batteries, battery management is needed to monitor battery state and ensure the safety of operation. Conventional battery management system equipped with a battery protection controller and electronic switches, which are typically Silicon MOSFET, to disconnect the battery from charger or load under critical conditions that can lead to dangerous reactions and prevents damages to the battery cells and the failure of the battery.

Nitride-based, such as gallium nitride (GaN)-based, devices have been widely used for high frequency electrical energy conversion systems because of low power losses and fast switching transition. In comparison with silicon (Si) metal oxide semiconductor field effect transistor (MOSFET), GaN high-electron-mobility transistor (HEMT) has a much better figure of merit and more promising performance for high-power and high-frequency applications. Therefore, it is desirable to have a nitride-based battery management system that can be used for higher frequency application as well as have a more compact size. More specifically, there is a need for a nitride-based bidirectional switching device which can work with conventional battery protection controller for battery charging and discharging management.

SUMMARY OF THE INVENTION

According to one aspect of the present invention, a nitride-based bidirectional switching device is provided for working with a battery protection controller having a power input terminal, a discharge over-current protection (DO) terminal, a charge over-current protection (CO) terminal, a voltage monitoring (VM) terminal and a ground terminal. The nitride-based bidirectional switching device comprises a nitride-based bidirectional switching element and an adaption module configured for receiving a DO signal and a CO signal from the battery protection controller and generating a main control signal for controlling the bidirectional switching element. By implementing the adaption circuit, the nitride-based bidirectional switching element can work with conventional battery protection controller for battery charging and discharging management. Therefore, a nitride-based battery management system can be realized with higher operation frequency as well as a more compact size.

According to another aspect of the present invention, the nitride-based bidirectional switching device further comprises a substrate potential management module configured for managing a potential of a main substrate of the bidirectional switching element. By implementing the substrate potential management circuit, a substrate potential of the bidirectional switching element is substantially equal to lower one of potentials of its conduction terminals no matter in which directions the bidirectional switching device is operated. Therefore, the bidirectional switching device can be operated with a stable substrate potential for conducting current in both directions.

BRIEF DESCRIPTION OF THE DRAWINGS

Aspects of the present disclosure may be readily understood from the following detailed description with reference to the accompanying figures. The illustrations may not necessarily be drawn to scale. That is, the dimensions of the various features may be arbitrarily increased or reduced for clarity of discussion. There may be distinctions between the artistic renditions in the present disclosure and the actual apparatus due to manufacturing processes and tolerances. Common reference numerals may be used throughout the drawings and the detailed description to indicate the same or similar components.

FIG. 8 shows how each of the diodes for forming a voltage-clamping elements is replaced with a nitride-based transistor;

FIGS. 9A-9B show cross-sections of a nitride-based IC chip integrated with the circuit as shown in FIG. 2;

FIGS. 15A-15E show resistive structures formed in a nitride-based IC chip according to various embodiments of the present invention;

FIGS. 17A-17E show steps of forming resistive structures according to various embodiment of the present invention.

DETAILED DESCRIPTION

In the following description, preferred examples of the present disclosure will be set forth as embodiments in conjunction with the accompanying drawings. The description and the drawings are to be regarded as illustrative rather than restrictive. Specific details may be omitted so as not to obscure the present disclosure; however, the disclosure is written to enable one skilled in the art to practice the teachings herein without undue experimentation.

Figure 1:
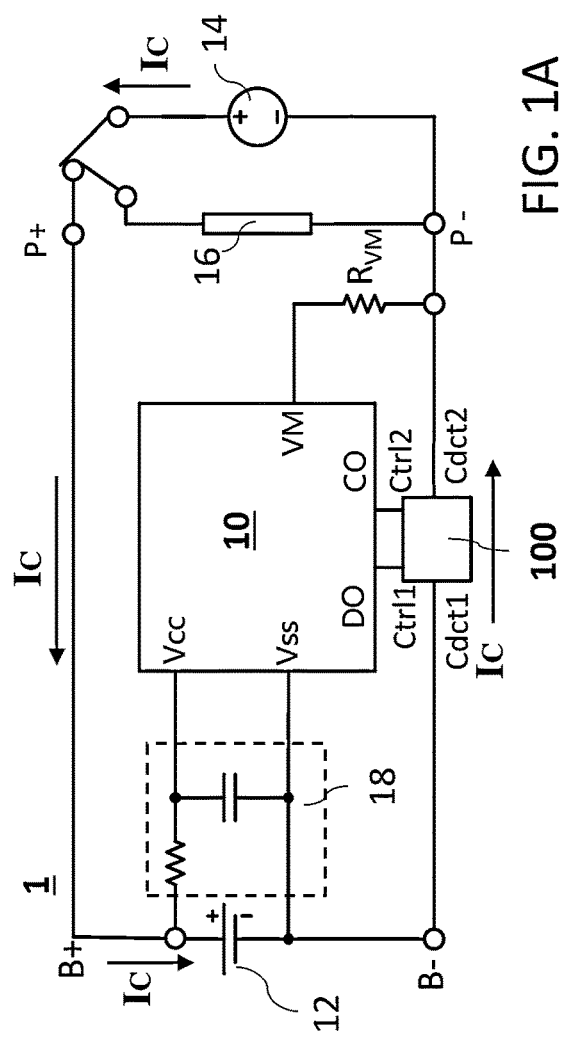
FIGS. 1A and 1B are circuit diagrams of a battery management system 1 at charging operation and discharge operations respectively according to some embodiments of the present disclosure.

FIGS. 1A and 1B are circuit diagrams of a battery management system 1 at charging operation and discharge operations respectively according to some embodiments of the present disclosure. As shown, the battery management system 1 may include a battery protection controller 10, a nitride-based bidirectional switching device 100 configured to work with the battery protection controller 10, a pair of positive and negative interface ports P+, P− configured for coupling with a load 16 and/or a charger 14 and a battery 12 which is to be charged by receiving electrical power from the charger 14 (as shown in FIG. 1A) or discharged by supplying electrical power to the load 16 (as shown in FIG. 1B).

The battery protection controller 10 may have a power input node Vcc electrically coupled to a positive terminal B+ of the battery 12 and a ground node Vss electrically coupled to the negative terminal B− of the battery 12. Optionally, a RC circuit 18 may be implemented between the battery 12 and the battery protection controller 10.

The battery protection controller 10 may further have a voltage monitoring node electrically coupled to the negative interfacing port P− through a voltage monitoring resistor $R_{VM}$ so as to receive a monitoring signal for over-current detection.

The battery protection controller 10 may further have a charge over-current protection node CO and a discharge over-current protection node DO for providing control signals to control the nitride-based bidirectional switching device 100 for over-current protection during charging and discharging operations respectively.

In particular, the nitride-based bidirectional switching device 100 may comprise a first control terminal Ctrl1 configured for electrically connecting to the DO node of the controller and a second control terminal Ctrl2 configured for electrically connecting to the CO node of the controller. The nitride-based bidirectional switching device 100 may further comprise a first conduction terminal Cdct1 configured for electrically connecting to the ground node Vss of the controller (and the negative terminal of the battery 12 and a second conduction terminal Cdct2 configured for electrically connecting to the negative interface port P−.

Referring to FIG. 1A. During a charging operation, a charging current $I_C$ is conducted from the charger 14 to the battery 12 and flows through the bidirectional switching device 100 from the conduction terminal Cdct1 to the conduction terminal Cdct2. When over-current is detected, the battery protection controller 10 generates a control signal at the charge over-current protection node CO to control the nitride-based bidirectional switching device 100 to disconnect the battery 12 from the charger 14.

Referring to FIG. 1B. During a discharging operation, a discharging current $I_D$ is conducted from the battery 12 to the load 16 and flows through the bidirectional switching device 100 from the conduction terminal Cdct2 to the conduction terminal Cdct1. When over-current is detected, the battery protection controller 10 generates a control signal at the discharge over-current protection node DO to control the nitride-based bidirectional switching device 100 to disconnect the battery 12 from the load 16.

FIGS. 2-7 are circuit diagrams of various exemplary circuits 100A-100F of the bidirectional switching device 100 according to various embodiments of the present invention. As shown in FIGS. 2-7, the bidirectional switching device 100 may generally comprise a main switching element Sm and an adaption module 200A-F configured for receiving a DO signal and a CO signal from the control terminal Ctrl1 and the control terminal Ctrl2 respectively and generating a main control signal for controlling the main switching element Sm.

The main switching element Sm may have a control electrode electrically connected to the adaption module 200A-F, a first conduction electrode connected to the conduction terminal Cdct1 and a second conduction electrode connected to the conduction terminal Cdct2. The main switching element Sm may be a nitride-based transistor having a gate acting as the control electrode of the main switching element Sm, a drain acting as the first conduction electrode of the main switching element Sm and a source acting as the second conduction electrode of the main switching element Sm. Preferably, the nitride-based transistor is a AlGaN/GaN enhancement-mode (E-mode) high-electron-mobility transistor (HEMT).

During normal operation of charging and discharging, a high-level voltage is applied to the control terminal Ctrl1 and a high-level voltage is applied to the control terminal Ctrl2, the main switching element Sm is turned on such that currents are allowed to flow in both directions between the conduction terminals Cdct1 and Ccdt2.

When over-current is detected during a discharging operation, a low-level voltage is applied to the control terminal Ctrl1 and a high-level voltage is applied to the control terminal Ctrl2, the main switching element Sm is turned off to disconnect the battery from the load such that the battery is protected from over-discharging or short-circuit.

When over-current is detected during a charging operation, a high-level voltage is applied to the control terminal Ctrl1 and a low-level voltage is applied to the control terminal Ctrl2, the main switching element Sm is turned off to disconnect the battery from the charger such that the battery is protected from over-charging.

Figures 2, 3:
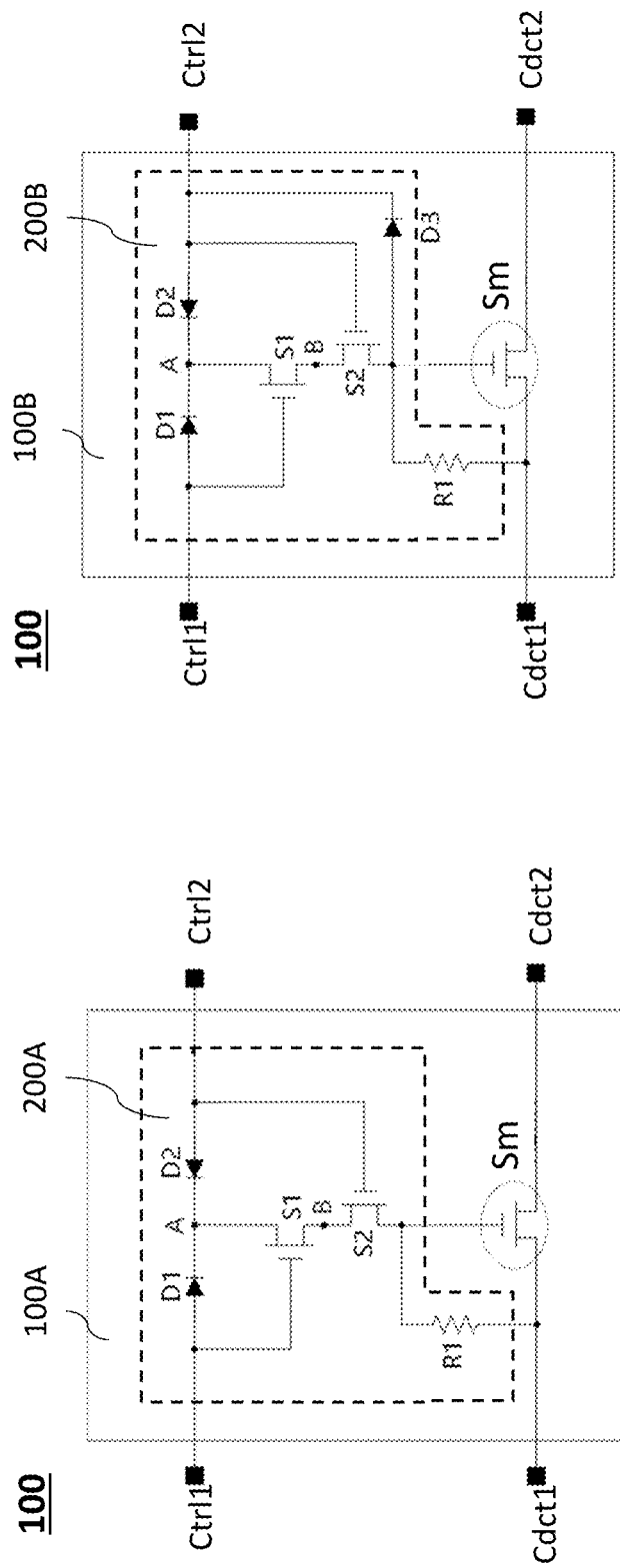
FIG. 2 is a circuit diagram of an exemplary circuit of a bidirectional switching device according to one embodiment of the present invention.
FIG. 3 is a circuit diagram of an exemplary circuit of a bidirectional switching device according to another embodiment of the present invention.
Figures 4, 5:
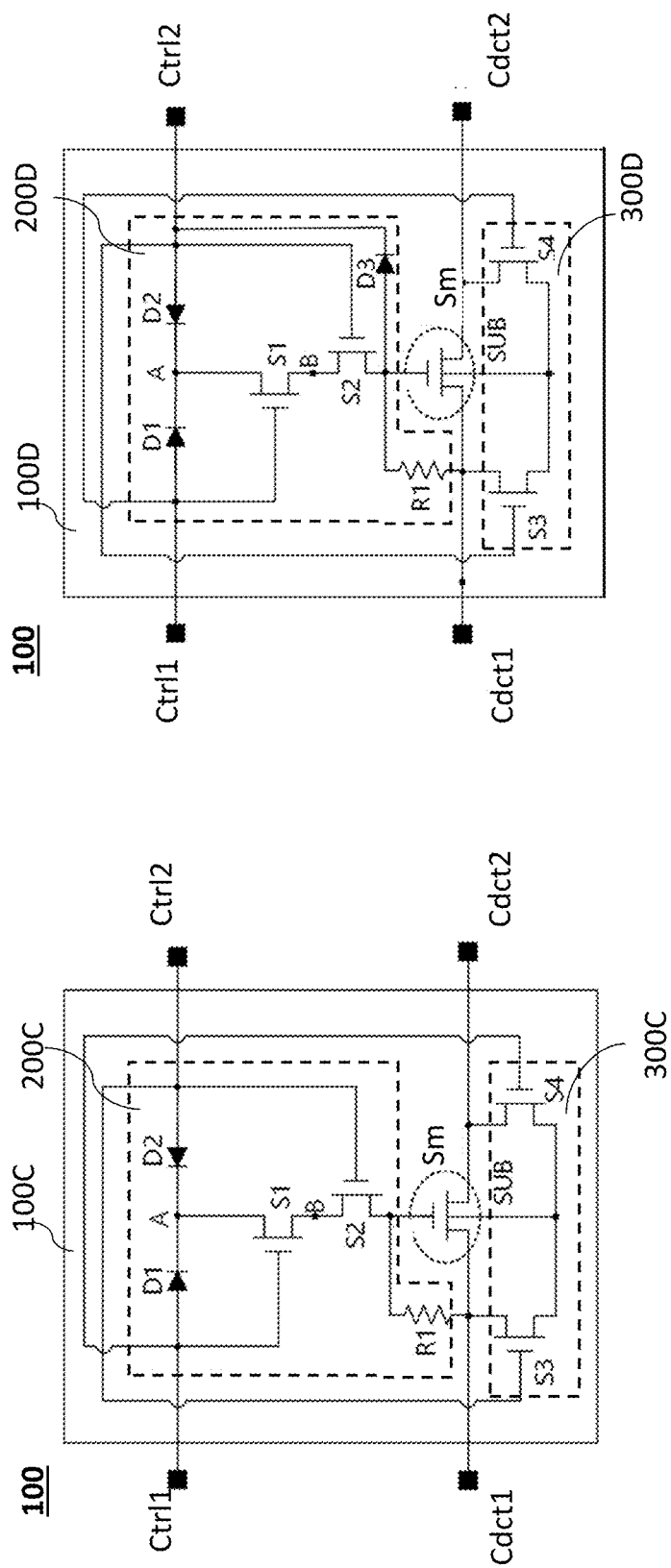
FIG. 4 is a circuit diagram of an exemplary circuit of a bidirectional switching device according to another embodiment of the present invention.
FIG. 5 is a circuit diagram of an exemplary circuit of a bidirectional switching device according to another embodiment of the present invention.
Figure 6:
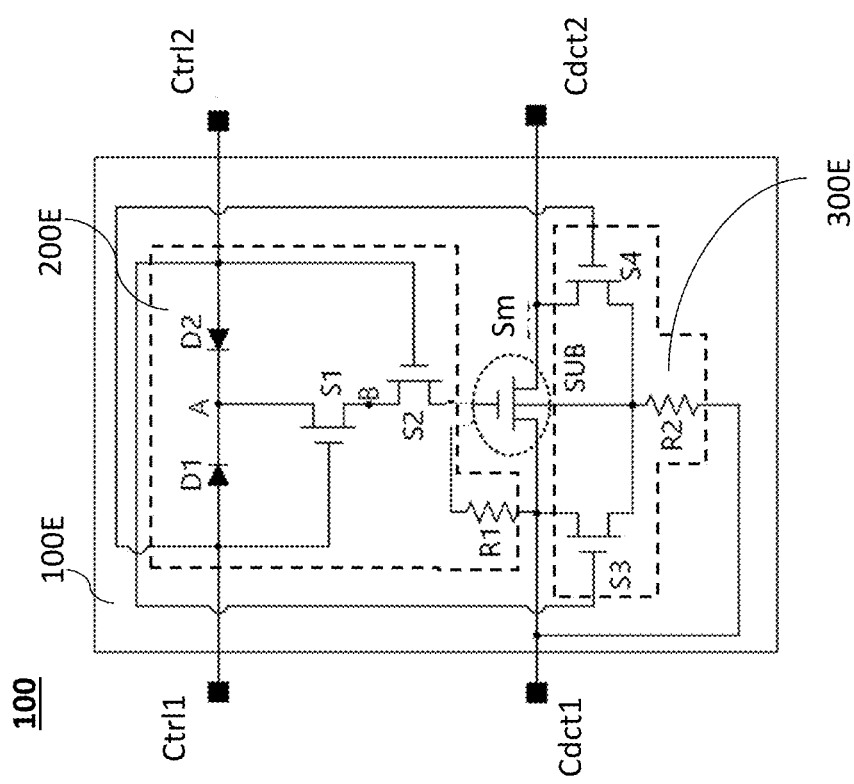
FIG. 6 is a circuit diagram of an exemplary circuit of a bidirectional switching device according to another embodiment of the present invention.

Referring to FIGS. 2, 4 and 6. The adaption module 200A, 200C and 200E may comprise a voltage-clamping element D1, a voltage-clamping element D2, an auxiliary switching element S1, an auxiliary switching element S2 and resistive element R1.

The voltage-clamping element D1 may have a positive electrode electrically connected to the control terminal Ctrl1 and a negative electrode electrically connected to an interconnection node A. The voltage-clamping element D2 may have a positive electrode electrically connected to the second control terminal Ctrl2 and a negative electrode electrically connected to the interconnection node A.

The auxiliary switching element S1 may have a control electrode electrically connected to the control terminal Ctrl1, a first conduction electrode connected to the interconnection node A and a second conduction electrode connected to an interconnection node B. The auxiliary switching element S2 may have a control electrode electrically connected to the second control terminal Ctrl2, a first conduction electrode connected to the interconnection node B and a second conduction electrode connected to the control electrode of the main switching element Sm.

The resistive element R1 may have a first electrode electrically connected to the control electrode of the main switching element Sm and a second electrode electrically connected to the conduction terminal Cdct1.

The voltage-clamping elements D1, D2 are configured for isolating the main switching element Sm from the control terminals Ctrl1 and Ctrl2 respectively to protect the main switching element Sm from being damaged due to short-circuit when voltage levels at the control terminals Ctrl1 and Ctrl2 are different at normal operation.

The voltage-clamping elements D1, D2 can be chosen to have suitable forward voltages for clamping a voltage applied to the control electrode of the main switching element Sm to a desired level so as to ensure the main switching element Sm can be operated normally. In general, the voltage-clamping elements D1 and D2 may have forward voltages $V_{F1}$ and $V_{F2}$ which are substantially the same.

The auxiliary switching elements S1 and S2 are configured for transforming the control signals received from the control terminals Ctrl1 and Ctrl2 respectively into the main control signal to control the main switching element Sm.

During normal operation of charging and discharging, the battery protection controller 10 may generate high-level voltage signals (e.g., 10V) at both of the DO and CO nodes. That is, a high-level voltage $V_{Ctrl1\_P}$ (10V) is applied to the control terminal Ctrl1 and a high-level voltage $V_{Ctrl2\_P}$ (10V) is applied to the control terminal Ctrl2. Both of the voltage-clamping elements D1 and D2 are forward-biased. Both of the auxiliary switching elements S1 and S2 are turned on. As a result, the voltage at control electrode of the main switching element Sm is pulled up to a high-level voltage equal to $V_{Ctrl1\_P}-V_{F1}$ (or $V_{Ctrl2\_P}-V_{F2}$). The main switching element Sm is then turned on such that charging/discharging currents are allowed to flow between the conduction terminals Cdct1 and Ccdt2.

When over-current is detected during a discharging operation or the battery 12 is fully discharged, the battery protection controller 10 may generate a low-level voltage signal (e.g., 0V) at the DO node and a high-level voltage signal (e.g., 10V) at the CO node. That is, a low-level voltage $V_{Ctrl1\_L}$ (0V) is applied to the control terminal Ctrl1 and a high-level voltage $V_{Ctrl2\_P}$ (10V) is applied to the control terminal Ctrl2. The voltage-clamping element D1 is reverse biased and the voltage-clamping element D2 is forward biased. The auxiliary switching element S1 is turned off and the auxiliary switching element S2 is turned on. As a result, the voltage at control electrode of the main switching element Sm is pulled down through the resistive element R1 to voltage level of the conductional terminal Cdct1 which is connected to the negative terminal B− of the battery 12 (i.e., a ground potential=0V). The main switching element Sm is then turned off to disconnect the battery 12 from the load 16 such that the battery can be protected from over-discharging or over-current.

When over-current is detected during a charging operation or the battery 12 is fully charged, the battery protection controller 10 may generate a high-level voltage signal (e.g., 10V) at the DO node and a low-level voltage signal (e.g., −10V) at the CO node such that a high-level voltage $V_{Ctrl1\_P}$ (10V) is applied to the control terminal Ctrl1 and a low-level voltage $V_{Ctrl2\_N}$ (−10V) is applied to the control terminal Ctrl2. The voltage-clamping element D1 is forward biased and the voltage-clamping element D2 is reverse biased. The auxiliary switching element S1 is turned on and the auxiliary switching element S2 is turned off. As a result, the voltage at control electrode of the main switching element Sm is pulled down to voltage level of the conductional terminal Cdct1 which is connected to the negative terminal B− of the battery 12 (i.e., a ground potential=0V). The main switching element Sm is then turned off to disconnect the battery 12 from the charger 14 such that the battery can be protected from over-charging or over-current.

Figure 7:
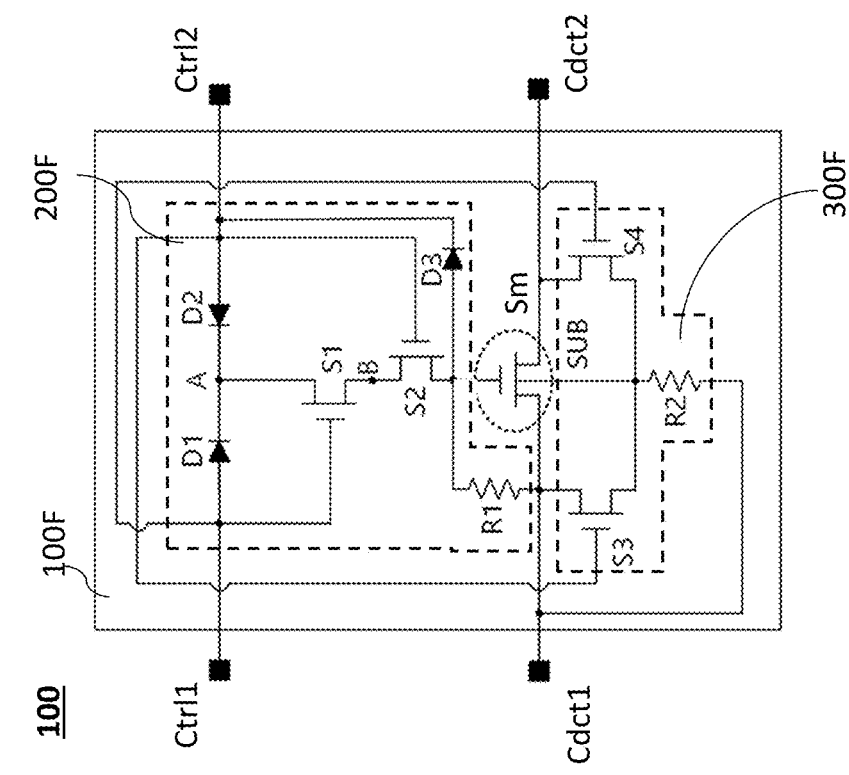
FIG. 7 is a circuit diagram of an exemplary circuit of a bidirectional switching device according to another embodiment of the present invention.

Referring to FIGS. 3, 5 and 7. The adaption modules 200B, 200D and 200F are similar to the adaption modules 200A, 200C and 200E respectively except for that the adaption modules 200B, 200D and 200F further comprise a voltage-clamping element D3 having a positive electrode electrically connected to the control electrode of the main switching element Sm and a negative electrode electrically connected to the control terminal Ctrl2. In general, the voltage-clamping elements D3 may have a forward voltages $V_{F3}$ which is substantially the same as forward voltages $V_{F1}$ and $V_{F2}$.

During normal operation of charging and discharging, the battery protection controller 10 may generate high-level voltage signals (e.g., 10V) at both of the DO and CO nodes. That is, a high-level voltage $V_{Ctrl\_P}$ (10V) is applied to the control terminal Ctrl1 and a high-level voltage $V_{Ctrl2\_P}$ (10V) is applied to the control terminal Ctrl2. All of the voltage-clamping elements D1, D2 and D3 are forward-biased. Both of the auxiliary switching elements S1 and S2 are turned on. As a result, the voltage at control electrode of the main switching element Sm is pulled up to a high-level voltage equal to $V_{Ctrl1\_P}-V_{F1}$ (or $V_{Ctrl2\_P}-V_{F2}$). The main switching element Sm is then turned on such that charging/discharging currents are allowed to flow between the conduction terminals Cdct1 and Ccdt2.

When over-current is detected during a discharging operation or the battery 12 is fully discharged, the battery protection controller 10 may generate a low-level voltage signal (e.g., 0V) at the DO node and a high-level voltage signal (e.g., 10V) at the CO node. That is, a low-level voltage $V_{Ctrl1\_L}$ (0V) is applied to the control terminal Ctrl1 and a high-level voltage $V_{Ctrl2\_P}$ (10V) is applied to the control terminal Ctrl2. The voltage-clamping elements D1 and D3 are reverse biased and the voltage-clamping element D2 is forward biased. The auxiliary switching element S1 is turned off and the auxiliary switching element S2 is turned on. As a result, the voltage at control electrode of the main switching element Sm is pulled down through the resistive element R1 to voltage level of the conductional terminal Cdct1 which is connected to the negative terminal B− of the battery 12 (i.e., 0V). The main switching element Sm is then turned off to disconnect the battery 12 from the load 16 such that the battery can be protected from over-discharging or over-current.

When over-current is detected during a charging operation or the battery 12 is fully charged, the battery protection controller 10 may generate a high-level voltage signal (e.g., 10V) at the DO node and a low-level voltage signal (e.g., −10V) at the CO node such that a high-level voltage $V_{Ctrl1\_P}$ (10V) is applied to the control terminal Ctrl1 and a low-level voltage $V_{Ctrl2\_N}$ (−10V) is applied to the control terminal Ctrl2. The voltage-clamping elements D1 and D3 are forward biased and the voltage-clamping element D2 is reverse biased. The auxiliary switching element S1 is turned on and the auxiliary switching element S2 is turned off. As a result, the voltage at control electrode of the main switching element Sm is pulled to a voltage level equal to $V_{Ctrl2\_N}+V_{F3}$. The main switching element Sm is then turned off to disconnect the battery 12 from the charger 14 such that the battery can be protected from over-charging or over-current.

In some embodiments, the adaption modules 200A-200F may further include a voltage clamping element D4 (not shown) having a positive electrode electrically connected to the control terminal Ctrl1 and a negative electrode electrically connected to the control electrode of the auxiliary switching element S1; and a voltage clamping element D5 (not shown) having a positive electrode electrically connected to the control terminal Ctrl2 and a negative electrode electrically connected to the control electrode of the auxiliary switching element S2.

As shown in FIGS. 4-7, the bidirectional switching device 100 may further comprise a substrate potential management module 300C-F configured for managing a potential of a main substrate SUB of the main switching element Sm to be substantially equal to a lower one of potentials of the first and second conduction terminals Cdct1 and Ccdt2.

During normal operation of charging and discharging, a high-level voltage is applied to the control terminal Ctrl1 and a high-level voltage is applied to the control terminal Ctrl2, the substrate potential management module 300C-F may manage the potential of the main substrate SUB to be substantially equal to a ground potential.

When over-current is detected during a discharging operation, a low-level voltage is applied to the control terminal Ctrl1 and a high-level voltage is applied to the control terminal Ctrl2, the substrate potential management module 300C-F may manage the potential of the main substrate SUB to be substantially equal to a ground potential.

When over-current is detected during a charging operation, a high-level voltage is applied to the control terminal Ctrl1 and a low-level voltage is applied to the control terminal Ctrl2, the substrate potential management module 300C-F may manage the potential of the main substrate SUB to be substantially equal to a potential of the second conduction terminal Ccdt2.

Referring to FIGS. 4 and 5. The substrate potential management module 300C/300D may comprise an auxiliary switching element S3 and an auxiliary switching element S4.

The auxiliary switching element S3 may have a control electrode electrically connected to the control terminal Ctrl2, a first conduction electrode electrically connected to the conduction terminal Cdct1, and a second conduction electrode electrically connected to the main substrate SUB of the main switching element Sm. The auxiliary switching element S4 may have a control electrode electrically connected to the control terminal Ctrl1, a first conduction electrode electrically connected to the conduction terminal Cdct2, and a second conduction electrode electrically connected to the main substrate SUB of the main switching element Sm.

During normal operation of charging and discharging, the battery protection controller 10 may generate high-level voltage signals (e.g., 10V) at both of the DO and CO nodes. That is, a high-level voltage $V_{Ctrl1\_P}$ (i.e., 10V) is applied to the control terminal Ctrl1 and a high-level voltage $V_{Ctrl2\_P}$ (i.e., 10V) is applied to the control terminal Ctrl2. Both of the auxiliary switching elements S3 and S4 are turned on. The potential of the substrate Vsub is given by Vsub=$V_{Cdct1}+V_{Cdct2}*R_{s3,on}/(R_{s3,on}+R_{s4,on})$, where $V_{Cdct1}$ and $V_{Cdct2}$ are voltage potentials at the conduction terminals Cdct1 and Cdct2 respectively, $R_{s3,on}$ and $R_{s4,on}$ are the on-resistances of auxiliary switching elements S3 and S4 respectively. $V_{Cdct1}$ is equal to the ground potential (i.e., 0V). The main switching element is turned on. $V_{Cdct2}$ is equal to on-state drain-source voltage $V_{m,on}$ of the main switching element Sm. As $V_{m,on}$ is very small, Vsub is substantially equal to $V_{Cdct1}$ that is equal to the ground potential (i.e., 0V).

When over-current is detected during a discharging operation or the battery 12 is fully discharged, the battery protection controller 10 may generate a low-level voltage signal (e.g., 0V) at the DO node and a high-level voltage signal (e.g., 10V) at the CO node. That is, a low-level voltage $V_{Ctrl1\_L}$ (i.e., 0V) is applied to the control terminal Ctrl1 and a high-level voltage $V_{Ctrl2\_P}$ (i.e., 10V) is applied to the control terminal Ctrl2. The auxiliary switching element S3 is turned on and the auxiliary switching element S4 is turned off. The potential of the substrate Vsub is given by Vsub=$V_{Cdct1}+V_{Cdct2}*R_{s3,on}/(R_{s3,on}+R_{s4,off})$, where $R_{s4,off}$ is the off-resistance of S4. $V_{Cdct1}$ is equal to the ground potential (0V). The main switching element Sm is turned off. $V_{Cdct2}$ is higher than $V_{Cdct1}$ for a difference equal to off-state drain-source voltage $V_{m,off}$ of the main switching element Sm. That is $V_{Cdct2}=V_{Cdct1}+V_{m,off}=V_{m,off}$. As $R_{s4,off}$ is much greater than $R_{s3,on}$, the potential of the substrate Vsub is substantially equal to $V_{Cdct1}$ that is equal to the ground potential (i.e., 0V).

When over-current is detected during a charging operation or the battery 12 is fully charged, the battery protection controller 10 may generate a high-level voltage signal (e.g., 10V) at the DO node and a low-level voltage signal (e.g., −10V) at the CO node such that a high-level voltage $V_{Ctrl1\_P}$ (i.e., 10V) is applied to the control terminal Ctrl1 and a low-level voltage $V_{Ctrl2\_N}$ (i.e., −10V) is applied to the control terminal Ctrl2. The auxiliary switching element S3 is turned off and the auxiliary switching element S4 is turned on. The potential of the substrate Vsub is given by Vsub=$V_{Cdct1}+V_{Cdct2}*R_{s3,off}/(R_{s3,off}+R_{s4,on})$, where $R_{s3,off}$ is the off-resistance of auxiliary switching elements S3. $V_{Cdct1}$ is equal to the ground potential (0V). The main switching element is turned off. $V_{Cdct2}$ is lower than $V_{Cdct1}$ for a difference equal to off-state drain-source voltage $V_{m,off}$ of the main switching element Sm. That is $V_{Cdct2}=V_{Cdct1}-V_{m,off}=-V_{m,off}$. As $R_{s3,off}$ is much greater than $R_{s4,on}$, the potential of the substrate Vsub is substantially equal to $V_{Cdct2}$, that is equal to $-V_{m,off}$.

Referring to FIGS. 6 and 7. The substrate potential management module 300E/300F are similar to the substrate potential management module 300C/300D respectively except for that the substrate potential management module 300E/300F further comprises a resistive element R2 having a first electrode electrically connected to the main substrate SUB of the main switching element Sm and a second electrode electrically connected to the conduction terminal Cdct1.

During normal operation of charging and discharging, the battery protection controller 10 may generate high-level voltage signals (e.g., 10V) at both of the DO and CO nodes. That is, a high-level voltage $V_{Ctrl1\_P}$ (i.e., 10V) is applied to the control terminal Ctrl1 and a high-level voltage $V_{Ctrl2\_P}$ (i.e., 10V) is applied to the control terminal Ctrl2. Both of the auxiliary switching elements S3 and S4 are turned on. The potential of the substrate Vsub is given by Vsub=$V_{Cdct1}+V_{Cdct2}*R_{s3,on}/(R_{s3,on}+R_{s4,on})$. $V_{Cdct1}$ is equal to the ground potential (i.e., 0V). The main switching element is turned on. $V_{Cdct2}$ is equal to on-state drain-source voltage $V_{m,on}$ of the main switching element Sm. As $V_{m,on}$ is very small, Vsub is substantially equal to $V_{Cdct1}$ that is equal to the ground potential (i.e., 0V).

When over-current is detected during a discharging operation or the battery 12 is fully discharged, the battery protection controller 10 may generate a low-level voltage signal (e.g., 0V) at the DO node and a high-level voltage signal (e.g., 10V) at the CO node. That is, a low-level voltage $V_{Ctrl1\_L}$ (i.e., 0V) is applied to the control terminal Ctrl1 and a high-level voltage $V_{Ctrl2\_P}$ (i.e., 10V) is applied to the control terminal Ctrl2. The auxiliary switching element S3 is turned on and the auxiliary switching element S4 is turned off. The potential of the substrate Vsub is given by Vsub=VCdct+$V_{Cdct2}*R_{eq,on}/(R_{eq,on}+R_{s4,off})$, where $R_{eq,on}=$ $R2*R_{s3,on}/(R2+R_{s3,on})$ which is the equivalent resistance of R2 and $R_{s3,on}$ connected in parallel. $V_{Cdct1}$ is equal to the ground potential (0V). The main switching element Sm is turned off. $V_{Cdct2}$ is higher than $V_{Cdct1}$ for a difference equal to off-state drain-source voltage $V_{m,off}$ of the main switching element Sm. That is $V_{Cdct2}=V_{Cdct1}+V_{m,off}=V_{m,off}$. As $R_{s4,off}$ is much greater than $R_{eq,on}$, the potential of the substrate Vsub is substantially equal to $V_{Cdct1}$ that is equal to the ground potential (i.e., 0V).

Alternatively, when over-current is detected during a discharging operation or the battery 12 is fully discharged, the battery protection controller 10 may generate a low-level voltage signal (e.g., 0V) at the DO node and a low-level voltage signal (e.g., 0V) at the CO node. That is, a low-level voltage $V_{Ctrl1\_L}$ (i.e., 0V) is applied to the control terminal Ctrl1 and a low-level voltage $V_{Ctrl2\_P}$ (i.e., 0V) is applied to the control terminal Ctrl2. Both of the auxiliary switching elements S3 and S4 are turned off. The potential of the substrate Vsub is given by Vsub=$V_{Cdct1}+V_{Cdct2}*R_{eq,off}/$ $(R_{eq,off}+R_{s4,off})$, where $R_{eq,off}=R2*R_{s3,off}/(R2+R_{s3,off})$ which is the equivalent resistance of R2 and $R_{s3,off}$ connected in parallel. $V_{Cdct1}$ is equal to the ground potential (0V). The main switching element Sm is turned off. $V_{Cdct2}$ is higher than $V_{Cdct1}$ for a difference equal to off-state drain-source voltage $V_{m,off}$ of the main switching element Sm. That is $V_{Cdct2}=V_{Cdct1}+V_{m,off}=V_{m,off}$. As $R_{s4,off}$ is similar to $R_{eq,off}$, the potential of the substrate Vsub is substantially equal to the ground potential (i.e., 0V).

When over-current is detected during a charging operation or the battery 12 is fully charged, the battery protection controller 10 may generate a high-level voltage signal (e.g., 10V) at the DO node and a low-level voltage signal (e.g., −10V) at the CO node such that a high-level voltage $V_{Ctrl1\_P}$ (i.e., 0V) is applied to the control terminal Ctrl1 and a low-level voltage $V_{Ctrl2\_N}$ (i.e., −10V) is applied to the control terminal Ctrl2. The auxiliary switching element S3 is turned off and the auxiliary switching element S4 is turned on. The potential of the substrate Vsub is given by Vsub=$V_{Cdct1}+V_{Cdct2}*R_{eq,off}/(R_{eq,off}+R_{s4,on})$. $V_{Cdct1}$ is equal to the ground potential (0V). The main switching element is turned off. $V_{Cdct2}$ is lower than $V_{Cdct1}$ for a difference equal to off-state drain-source voltage $V_{m,off}$ of the main switching element Sm. That is $V_{Cdct2}=V_{Cdct1}-V_{m,off}=-V_{m,off}$. As $R_{eq,off}$ is much greater than $R_{s4,on}$, the potential of the substrate Vsub is substantially equal to $V_{Cdct2}$. that is equal to $-V_{m,off}$.

In some embodiments, the substrate potential management module 300C-300F may further include a voltage clamping element D6 (not shown) having a positive electrode electrically connected to the control terminal Ctrl2 and a negative electrode electrically connected to the control electrode of the auxiliary switching element S3; and a voltage clamping element D7 (not shown) having a positive electrode electrically connected to the control terminal Ctrl1 and a negative electrode electrically connected to the control electrode of the auxiliary switching element S4.

The voltage-clamping element D1/D2/D3/D4/D5/D6/D7 may comprise a diode having an anode acting as the positive electrode of the voltage-clamping element D1/D2/D3/D4/D5/D6/D7 and a cathode acting as the negative electrode of the voltage-clamping element D1/D2/D3/D4/D5/D6/D7. Alternatively, the voltage-clamping element D1/D2/D3/D4/D5/D6/D7 may comprise a plurality of diodes connected in series, having an anode of a diode at one end to act as the positive electrode of the voltage-clamping element D1/D2/ D3/D4/D5/D6/D7 and a cathode of a diode at another end to act as the negative electrode of the voltage-clamping element D1/D2/D3/D4/D5/D6/D7.

As shown in FIG. 8, each of the diodes for forming the voltage-clamping elements D1/D2/D3/D4/D5/D6/D7 may be replaced with a transistor having a gate and a source being connected together to act as the anode of the diode and a drain configured to act as the cathode of the diode. The transistor may be a Si MOSFET or a AlGaN/GaN high-electron-mobility transistor (HEMT).

The auxiliary switching elements S1/S2/S3/S4 may be a transistor having a gate acting as the control electrode of the auxiliary switching element S1/S2/S3/S4, a drain acting as the first conduction electrode of the auxiliary switching element S1/S2/S3/S4 and a source acting as the second conduction electrode of the auxiliary switching element S1/S2/S3/S4. The transistor may be a Si MOSFET or a AlGaN/GaN high-electron-mobility transistor (HEMT).

The resistive elements R1/R2 may be a resistor having a first terminal acting as the first electrode of the resistive element R1/R2 and a second terminal acting as the second electrode of the resistive element R1/R2.

The resistor R1 may be selected to have a resistance value much higher than the on-resistance of the auxiliary switching elements S1/S2 and much lower than an off-resistance of the auxiliary switching elements S1/S2. For example, the resistor R1 may be selected to have a resistance value in a range from approximately 0.1Ω to approximately 1GΩ.

The resistor R2 may be selected to have a resistance value much higher than the on-resistance of the auxiliary switching elements S3/S4 and much lower than an off-resistance of the auxiliary switching elements S3/S4. For example, the resistor R2 may be selected to have a resistance value in a range from approximately 0.1Ω to approximately 1GΩ.

Figure 11:
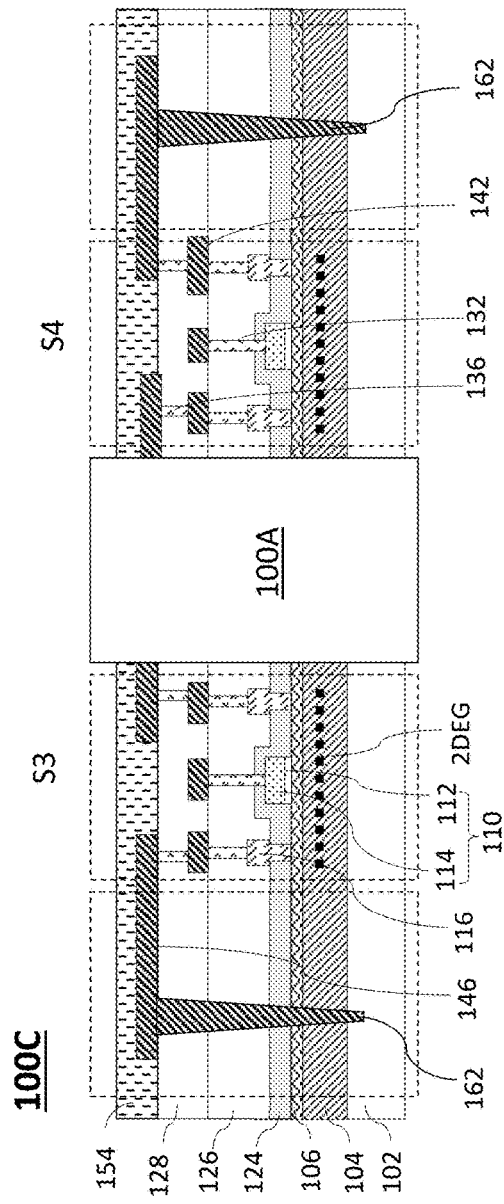
FIG. 11 shows a cross-section of a nitride-based IC chip integrated with the circuit as shown in FIG. 4.
Figure 12:
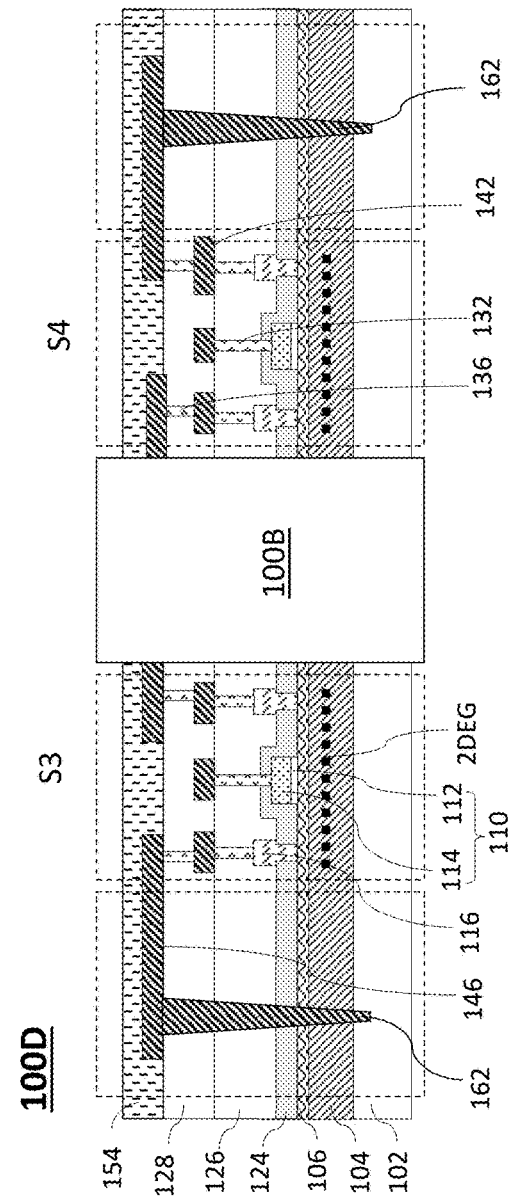
FIG. 12 shows a cross-section of a nitride-based IC chip integrated with the circuit as shown in FIG. 5.
Figure 13:
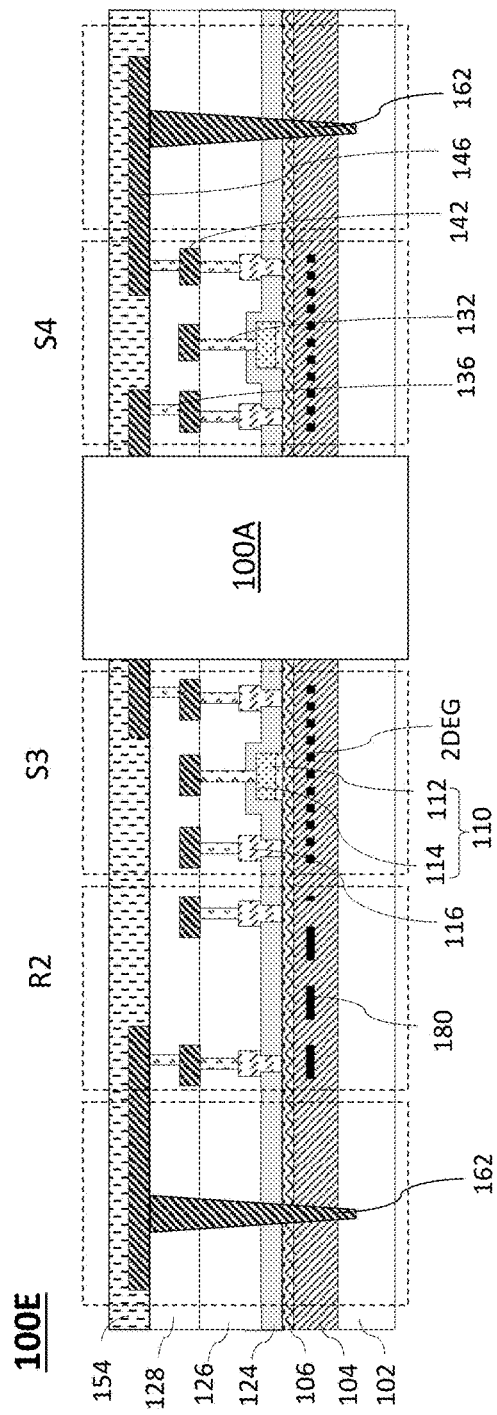
FIG. 13 shows a cross-section of a nitride-based IC chip integrated with the circuit as shown in FIG. 6.
Figure 14:
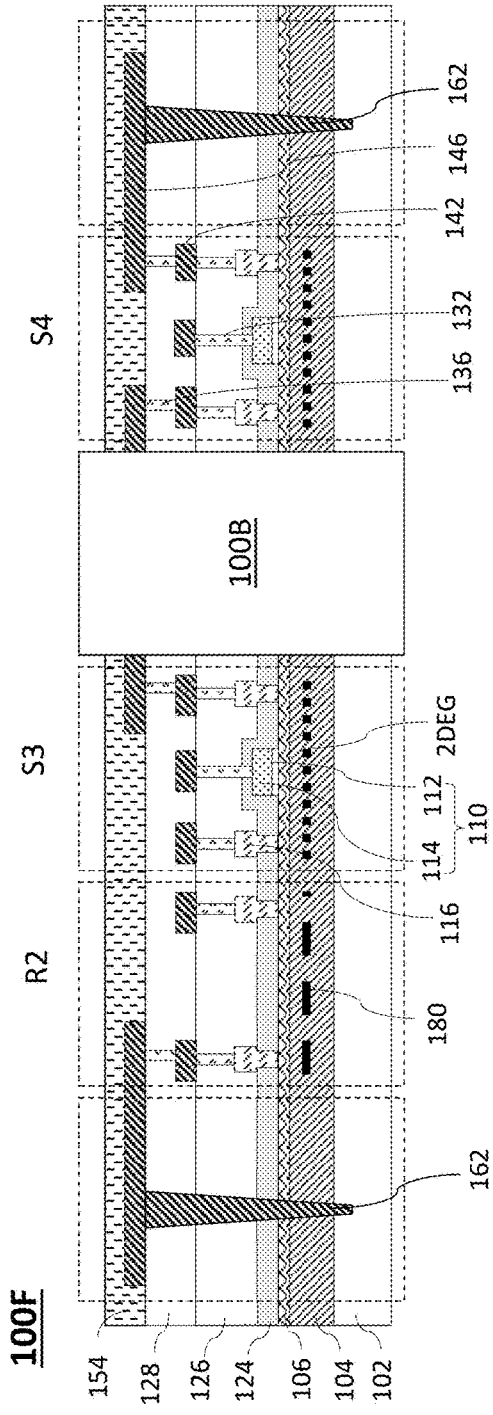
FIG. 14 shows a cross-section of a nitride-based IC chip integrated with the circuit as shown in FIG. 7.

The nitride-based bidirectional switching device 100 may be integrated into a nitride-based integrated circuit (IC) chip. FIGS. 9A-9B and 10A-10B show cross-sections of nitride-based IC chips integrated with the circuits 100A and 100B respectively. For simplicity, FIGS. 11 and 12 show cross-sections of nitride-based IC chips integrated with the circuit 100C and 100D on basis of the circuits 100A and 100B respectively; and FIGS. 13 and 14 show cross-sections of nitride-based IC chips integrated with the circuit 100E and 100F on basis of the circuits 100A and 100B respectively.

Referring to FIGS. 9A-9B. The nitride-based IC chip integrated with the circuit 100A may include a substrate 102, a first nitride-based semiconductor layer 104, a second nitride-based semiconductor layer 106, gate structures 110, S/D electrodes 116, a first passivation layer 124, a second passivation layer 126, a third passivation layer 128, one or more first conductive vias 132, one or more second conductive vias 136, one or more first conductive lines 142, one or more second conductive lines 146, a protection layer 154, conductive pads 170 and resistive structures 180.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The nitride-based semiconductor layer 104 is disposed over the substrate 102. The exemplary materials of the nitride-based semiconductor layer 104 can include, for example but are not limited to, nitrides or group III-V compounds, such as GaN, AlN, InN, $InxAl_yGa_{(1-x-y)}N$ where $x+y≤1$, $Al_yGa_{(1-y)}N$ where $y≤1$. The exemplary structures of the nitride-based semiconductor layer 104 can include, for example but are not limited to, multilayered structure, superlattice structure and composition-gradient structures.

The nitride-based semiconductor layer 106 is disposed on the nitride-based semiconductor layer 104. The exemplary materials of the nitride-based semiconductor layer 106 can include, for example but are not limited to, nitrides or group III-V compounds, such as GaN, AlN, InN, $InxAl_yGa_{(1-x-y)}N$ where $x+y≤1$, $Al_yGa_{(1-y)}N$ where $y≤1$.

The exemplary materials of the nitride-based semiconductor layers 104 and 106 are selected such that the nitride-based semiconductor layer 106 has a bandgap (i.e., forbidden band width) greater than a bandgap of the nitride-based semiconductor layer 104, which causes electron affinities thereof different from each other and forms a heterojunction therebetween. For example, when the nitride-based semiconductor layer 104 is an undoped GaN layer having a bandgap of approximately 3.4 eV, the nitride-based semiconductor layer 106 can be selected as an AlGaN layer having bandgap of approximately 4.0 eV. As such, the nitride-based semiconductor layers 104 and 106 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the nitride-based IC chip is available to include one or more GaN-based high-electron-mobility transistors (HEMT).

In some embodiments, the nitride-based IC chip may further include a buffer layer, a nucleation layer, or a combination thereof (not illustrated). The buffer layer can be disposed between the substrate 102 and the nitride-based semiconductor layer 104. The buffer layer can be configured to reduce lattice and thermal mismatches between the substrate 102 and the nitride-based semiconductor layer 104, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof.

The nucleation layer may be formed between the substrate 102 and the buffer layer. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The gate structures 110 are disposed on/over/above the second nitride-based semiconductor layer 106. Each of the gate structures 110 may include an optional gate semiconductor layer 112 and a gate metal layer 114. The gate semiconductor layer 112 and the gate metal layer 114 are stacked on the nitride-based semiconductor layer 106. The gate semiconductor layer 112 are between the nitride-based semiconductor layer 106 and the gate metal layer 114. The gate semiconductor layer 112 and the gate metal layer 114 may form a Schottky barrier. In some embodiments, the nitride-based IC chip may further include an optional dielectric layer (not illustrated) between the p-type doped III-V compound semiconductor layer 112 and the gate metal layer 114.

The nitride-based transistors forming the nitride-based bidirectional switching device 100 may be enhancement mode devices, which are in a normally-off state when their gate electrodes 114 are at approximately zero bias. Specifically, the gate semiconductor layer 112 may be a p-type doped III-V compound semiconductor layer. The p-type doped III-V compound semiconductor layer 112 may create at least one p-n junction with the nitride-based semiconductor layer 106 to deplete the 2DEG region, such that at least one zone of the 2DEG region corresponding to a position below the corresponding gate structure 110 has different characteristics (e.g., different electron concentrations) than the rest of the 2DEG region and thus is blocked. Due to such mechanism, the bidirectional switching device 100 has a normally-off characteristic. In other words, when no voltage is applied to the gate electrodes 114 or a voltage applied to the gate electrodes 114 is less than a threshold voltage (i.e., a minimum voltage required to form an inversion layer below the gate structures 110), the zone of the 2DEG region below the gate structures 110 is kept blocked, and thus no current flows therethrough. Moreover, by providing the p-type doped III-V compound semiconductor layers 112, gate leakage current is reduced and an increase in the threshold voltage during the off-state is achieved.

In some embodiments, the p-type doped III-V compound semiconductor layers 112 can be omitted, such that the bidirectional switching device 100 is a depletion-mode device, which means the transistors are in a normally-on state at zero gate-source voltage.

The exemplary materials of the p-type doped III-V compound semiconductor layers 112 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg.

In some embodiments, the nitride-based semiconductor layer 104 includes undoped GaN and the nitride-based semiconductor layer 106 includes AlGaN, and the p-type doped III-V compound semiconductor layers 112 are p-type GaN layers which can bend the underlying band structure upwards and to deplete the corresponding zone of the 2DEG region, so as to place the bidirectional switching device 11 into an off-state condition.

In some embodiments, the gate electrodes 114 may include metals or metal compounds. The gate electrodes 114 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 114 may include, for example but are not limited to, nitrides, oxides, silicides, doped semiconductors, or combinations thereof.

In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

The S/D electrodes 116 are disposed on the nitride-based semiconductor layer 106. The "S/D" electrode means each of the S/D electrodes 116 can serve as a source electrode or a drain electrode, depending on the device design. The S/D electrodes 116 can be located at two opposite sides of the corresponding gate structure 110 although other configurations may be used, particularly when plural source, drain, or gate electrodes are employed in the device. Each of the gate structure 110 can be arranged such that each of the gate structure 110 is located between the at least two of the S/D electrodes 116. The gate structures 110 and the S/D electrodes 116 can collectively act as at least one nitride-based/GaN-based HEMT with the 2DEG region.

In the exemplary illustration, the adjacent S/D electrodes 116 are symmetrical about the gate structure 110 therebetween. In some embodiments, the adjacent S/D electrodes 116 can be optionally asymmetrical about the gate structure 110 therebetween. That is, one of the S/D electrodes 116 may be closer to the gate structure 110 than another one of the S/D electrodes 116.

In some embodiments, the S/D electrodes 116 can include, for example but are not limited to, metals, alloys, doped semiconductor materials (such as doped crystalline silicon), compounds such as silicides and nitrides, other conductor materials, or combinations thereof. The exemplary materials of the S/D electrodes 116 can include, for example but are not limited to, Ti, AlSi, TiN, or combinations thereof. The S/D electrodes 116 may be a single layer, or plural layers of the same or different composition. In some embodiments, the S/D electrodes 116 may form ohmic contacts with the nitride-based semiconductor layer 106. The ohmic contact can be achieved by applying Ti, Al, or other suitable materials to the S/D electrodes 116. In some embodiments, each of the S/D electrodes 116 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The passivation layer 124 is disposed over the nitride-based semiconductor layer 106. The passivation layer 124 can be formed for a protection purpose or for enhancing the electrical properties of the device (e.g., by providing an electrically isolation effect between/among different layers/elements). The passivation layer 124 covers a top surface of the nitride-based semiconductor layer 106. The passivation layer 124 may cover the gate structures 110. The passivation layer 124 can at least cover opposite two sidewalls of the gate structures 110. The S/D electrodes 116 can penetrate/pass through the passivation layer 124 to contact the nitride-based semiconductor layer 106. The exemplary materials of the passivation layer 124 can include, for example but are not limited to, $SiN_x$, $SiO_x$, $Si_3N_4$, SiON, SiC, SiBN, SiCBN, oxides, nitrides, poly(2-ethyl-2-oxazoline) (PEOX), or combinations thereof. In some embodiments, the passivation layer 124 can be a multi-layered structure, such as a composite dielectric layer of $Al_2O_3$/SiN, $Al_2O_3$/$SiO_2$, AlN/SiN, AlN/$SiO_2$, or combinations thereof.

The passivation layer 126 is disposed above the passivation layer 124 and the S/D electrodes 116. The passivation layer 126 covers the passivation layer 124 and the S/D electrodes 116. The passivation layer 126 can serve as a planarization layer which has a level top surface to support other layers/elements. The exemplary materials of the passivation layer 126 can include, for example but are not limited to, $SiN_x$, $SiO_x$, $Si_3N_4$, SiON, SiC, SiBN, SiCBN, oxides, PEOX, or combinations thereof. In some embodiments, the passivation layer 126 is a multi-layered structure, such as a composite dielectric layer of $Al_2O_3$/SiN, $Al_2O_3$/$SiO_2$, AlN/SiN, AlN/$SiO_2$, or combinations thereof.

The conductive vias 132 are disposed within the passivation layer 126 and passivation layer 124. The conductive vias 132 penetrate the passivation layer 126 and passivation layer 124. The conductive vias 132 extend longitudinally to electrically couple with the gate structure 110 and the S/D electrodes 116, respectively. The upper surfaces of the conductive vias 132 are free from coverage of the passivation layer 126. The exemplary materials of the conductive vias 132 can include, for example but are not limited to, conductive materials, such as metals or alloys.

The conductive lines 142 are disposed on the passivation layer 126 and the conductive vias 132. The conductive lines 142 are in contact with the conductive vias 132. The conductive lines 142 may be formed by patterning a conductive layer disposed on the passivation layer 126 and the conductive vias 132. The exemplary materials of the conductive lines 142 can include, for example but are not limited to, conductive materials. The conductive lines 142 may include a single film or multilayered film having Ag, Al, Cu, Mo, Ni, alloys thereof, oxides thereof, nitrides thereof, or combinations thereof.

The passivation layer 128 is disposed above the passivation layer 126 and the conductive lines 142. The passivation layer 128 covers the passivation layer 126 and the conductive lines 142. The passivation layer 128 can serve as a planarization layer which has a level top surface to support other layers/elements. The exemplary materials of the passivation layer 128 can include, for example but are not limited to, $SiN_x$, $SiO_x$, $Si_3N_4$, SiON, SiC, SiBN, SiCBN, oxides, PEOX, or combinations thereof. In some embodiments, the passivation layer 128 is a multi-layered structure, such as a composite dielectric layer of $Al_2O_3$/SiN, $Al_2O_3$/$SiO_2$, AlN/SiN, AlN/$SiO_2$, or combinations thereof.

The conductive vias 136 are disposed within the passivation layer 128. The conductive vias 136 penetrate the passivation layer 128. The conductive vias 136 extend longitudinally to electrically couple with the conductive lines 142. The upper surfaces of the conductive vias 136 are free from coverage of the passivation layer 136. The exemplary materials of the conductive vias 136 can include, for example, but are not limited to, conductive materials, such as metals or alloys.

The conductive lines 146 are disposed on the passivation layer 128 and the conductive vias 136. The conductive lines 146 are is in contact with the conductive vias 136. The conductive lines 146 are may be formed by patterning a conductive layer disposed on the passivation layer 128 and the conductive vias 136. The exemplary materials of the conductive layer 146 can include, for example but are not limited to, conductive materials. The conductive layer 146 may include a single film or multilayered film having Ag, Al, Cu, Mo, Ni, alloys thereof, oxides thereof, nitrides thereof, or combinations thereof.

The protection layer 154 is disposed above the passivation layer 128 and the conductive layer 146. The protection layer 154 covers the passivation layer 128 and the conductive layer 146. The protection layer 154 can prevent the conductive layer 146 from oxidizing. Some portions of the conductive layer 146 can be exposed through openings in the protection layer 154 to form the conductive pads 170, which are configured to electrically connect to external elements (e.g., an external circuit).

The conductive pads 170 may include one or more conductive pads to act as the first control terminal Ctrl1, the second control terminal Ctrl2, the first conduction terminal Cdct1 and second conduction terminal Cdct2 respectively.

Conductive lines 142 or 146, conductive vias 132 or 136 can be configured to electrically connect different layers/elements to form the main switching element Sm and the adaption module which includes voltage-clamping element D1, voltage-clamping element D2, auxiliary switching element S1, auxiliary switching element S2 and resistive element R1.

FIGS. 15A-15E show different ways of forming the resistive structures 180 according to various embodiments of the present invention. Referring to FIG. 15A, the resistive structures 180 may be formed by patterning a two-dimensional electron gas region adjacent to the heterojunction interface between the first and second nitride-based semiconductor layers (i.e., the 2DEG region). Referring to FIG. 15B, the resistive structures 180 may be formed by patterning the gate metal layer 114. Referring to FIG. 15C, the resistive structures 180 may be formed by patterning the S/D electrode layer 116. Referring to FIG. 15D, the resistive structures 180 may be formed by patterning the first conductive layer 142. Referring to FIG. 15E, the resistive structures 180 may be formed by patterning the second conductive layer 146.

Figure 10A:
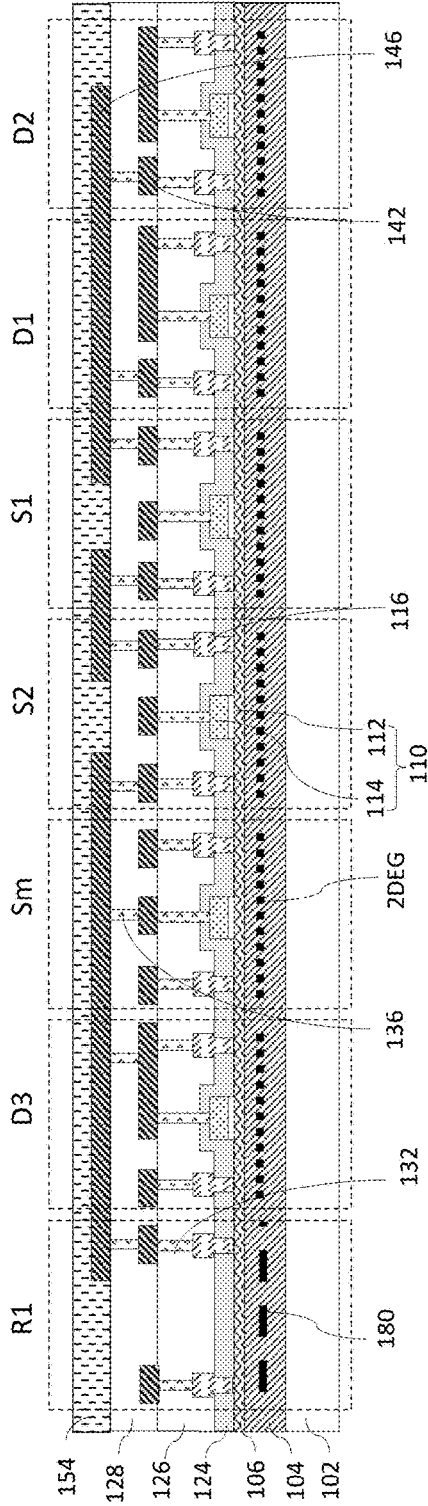
FIGS. 10A-10B show cross-sections of a nitride-based IC chip integrated with the circuit as shown in FIG. 3.
Figure 10B:
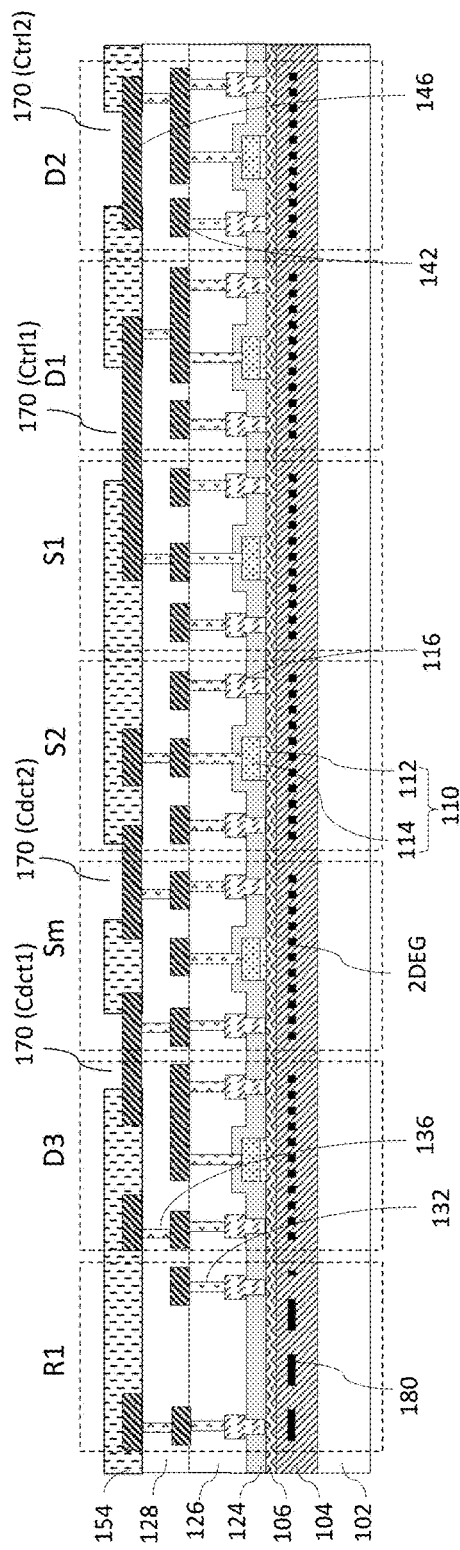

Referring to FIGS. 10A-10B, the nitride-based IC chip integrated with the circuit 100B may have a layered structure similar to the IC chip integrated with the circuit 100A. Conductive lines 142 or 146 and conductive vias 132 or 136 can be configured to electrically connect different layers/elements to form the main switching element Sm and the adaption module which includes voltage-clamping element D1, voltage-clamping element D2, voltage-clamping element D3, auxiliary switching element S1, auxiliary switching element S2 and resistive element R1.

Referring to FIG. 11, the nitride-based IC chip integrated with the circuit 100C may have a layered structure similar to the IC chip integrated with the circuit 100A except for that the nitride-based IC chip integrated with the circuit 100C further comprises one or more through gallium vias (TGVs) 162.

The TGVs 162 may be formed to extend longitudinally from the second conductive layer 146 and penetrate into the substrate 102. The upper surfaces of the TGVs 162 are free from coverage of the third passivation layer 128. In some embodiments, the TGVs 162 may be formed to extend longitudinally from the first conductive layer 142 and penetrate into the substrate 102. The upper surfaces of the TGVs 162 are free from coverage of the second passivation layer 126. The exemplary materials of the TGVs 162 can include, for example, but are not limited to, conductive materials, such as metals or alloys.

Conductive lines 142 or 146, conductive vias 132 or 136 and TGVs 162 can be configured to electrically connect different layers/elements/conductive lines to form the main switching element Sm; the adaption module which includes voltage-clamping element D1, voltage-clamping element D2, auxiliary switching element S1, auxiliary switching element S2 and resistive element R1; and the substrate potential management module which includes auxiliary switching element S3 and auxiliary switching element S4.

Referring to FIG. 12, the nitride-based IC chip integrated with the circuit 100D may have a layered structure similar to the IC chip integrated with the circuit 100B except for that the nitride-based IC chip integrated with the circuit 100D further comprises one or more through gallium vias (TGVs) 162. Conductive lines 142 or 146, conductive vias 132 or 136 and TGVs 162 can be configured to electrically connect different layers/elements to form the main switching element Sm; the adaption module which includes voltage-clamping element D1, voltage-clamping element D2, voltage-clamping element D3, auxiliary switching element S1, auxiliary switching element S2, and resistive element R1; and the substrate potential management module which includes auxiliary switching element S3 and auxiliary switching element S4.

Referring to FIG. 13, the nitride-based IC chip integrated with the circuit 100E may have a layered structure similar to the IC chip integrated with the circuit 100A except for that the nitride-based IC chip integrated with the circuit 100E further comprises one or more through gallium vias (TGVs) 162. Conductive lines 142 or 146, conductive vias 132 or 136 and TGVs 162 can be configured to electrically connect different layers/elements to form the main switching element Sm; the adaption module which includes voltage-clamping element D1, voltage-clamping element D2, auxiliary switching element S1, auxiliary switching element S2, and resistive element R1; and the substrate potential management module which includes auxiliary switching element S3, auxiliary switching element S4 and resistive element R2.

Referring to FIG. 14, the nitride-based IC chip integrated with the circuit 100F may have a layered structure similar to the IC chip integrated with the circuit 100B except for that the nitride-based IC chip integrated with the circuit 100F further comprises one or more through gallium vias (TGVs) 162. Conductive lines 142 or 146, conductive vias 132 or 136 and TGVs 162 can be configured to electrically connect different layers/elements to form the main switching element Sm; the adaption module which includes voltage-clamping element D1, voltage-clamping element D2, voltage-clamping element D3, auxiliary switching element S1, auxiliary switching element S2, and resistive element R1; and the substrate potential management module which includes auxiliary switching element S3, auxiliary switching element S4 and resistive element R2.

Different stages of a method for manufacturing the nitride-based IC chip integrated with the circuit 100A/100B are shown in FIGS. 16A-16J and described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes. The process for forming the passivation layers serving as a planarization layer generally includes a chemical mechanical polish (CMP) process. The process for forming the conductive vias generally includes forming vias in a passivation layer and filling the vias with conductive materials. The process for forming the conductive lines generally includes photolithography, exposure and development, etching, other suitable processes, or combinations thereof.

Figure 16A:
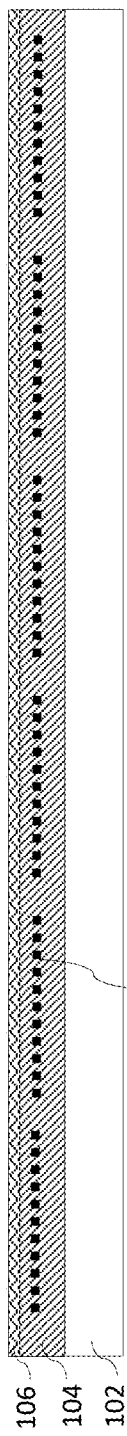
FIGS. 16A-16J show different stages of a method for manufacturing a nitride-based IC chip according to various embodiment of the present invention.

Referring to FIG. 16A, a substrate 102 is provided. Nitride-based semiconductor layers 104 and 106 can be formed over the substrate 102 in sequence by using the above-mentioned deposition techniques. A two-dimensional electron gas (2DEG) region is formed adjacent to a heterojunction interface between the first nitride-based semiconductor layer 104 and the second nitride-based semiconductor layer 106.

In some embodiments, the 2DEG region may also be patterned by implantation to form one or more resistive structures 180 as shown in FIG. 17A.

Figure 16B:
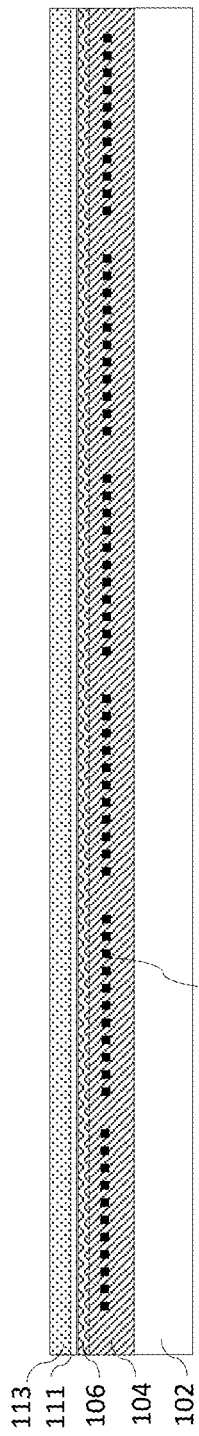

Referring to FIG. 16B, A blanket p-type doped III-V compound semiconductor layer 111 and a blanket gate metal layer 113 can be formed above the nitride-based semiconductor layer 106 in sequence by using the above-mentioned deposition techniques.

Figure 16C:
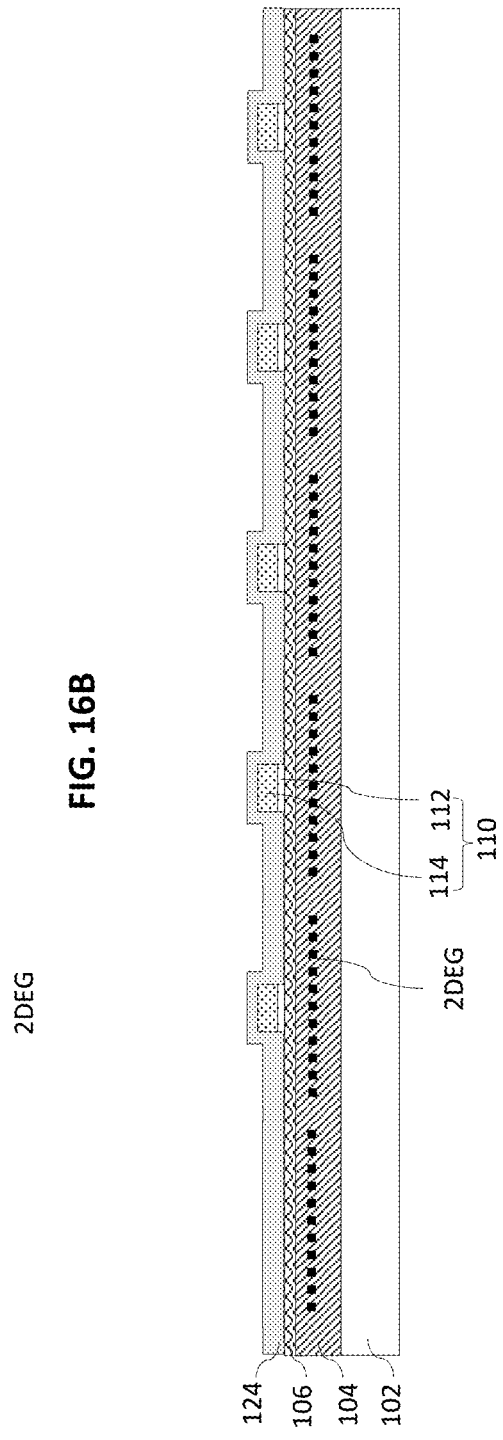

Referring to FIG. 16C, the blanket p-type doped III-V compound semiconductor layer 111 and the blanket gate metal layer 113 are patterned to form a plurality of gate structures 110 over the nitride-based semiconductor layer 106. Each of the gate structures 110 includes a p-type doped III-V compound semiconductor layer 112 and a gate metal layer 114. A passivation layer 124 can then be formed to cover the gate structures 110 by using the above-mentioned deposition techniques.

In some embodiments, the blanket gate metal layer 113 may also be patterned to form one or more resistive structures 180 as shown in FIG. 17B at the same step of forming the gate structures 110.

Figure 16D:
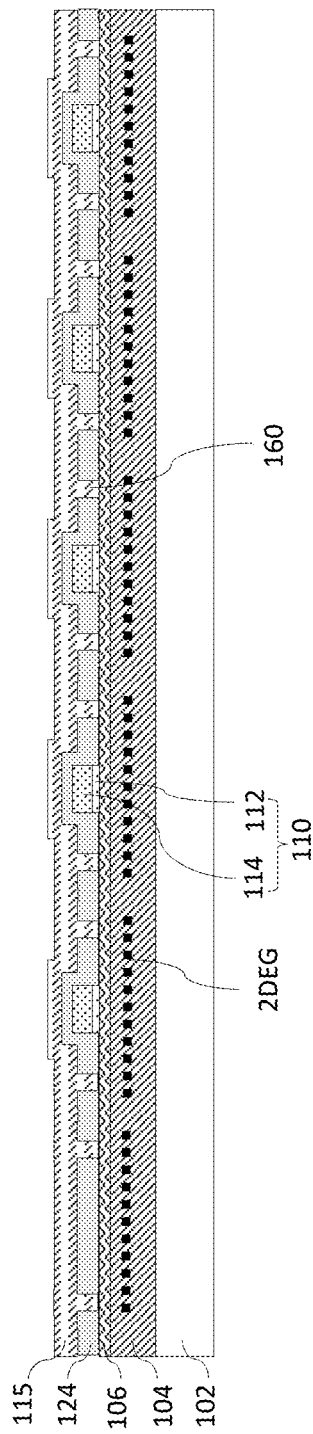

Referring to FIG. 16D, some S/D regions 160 are formed by removing some portions of the passivation layer 124. At least one portion of the nitride-based semiconductor layer 106 is exposed from the S/D regions 160. A blanket conductive layer 115 is formed to cover the nitride-based semiconductor layer 106 and the passivation layer 124, and fill the S/D regions 160, thereby contacting with the nitride-based semiconductor layer 106.

Figure 16E:
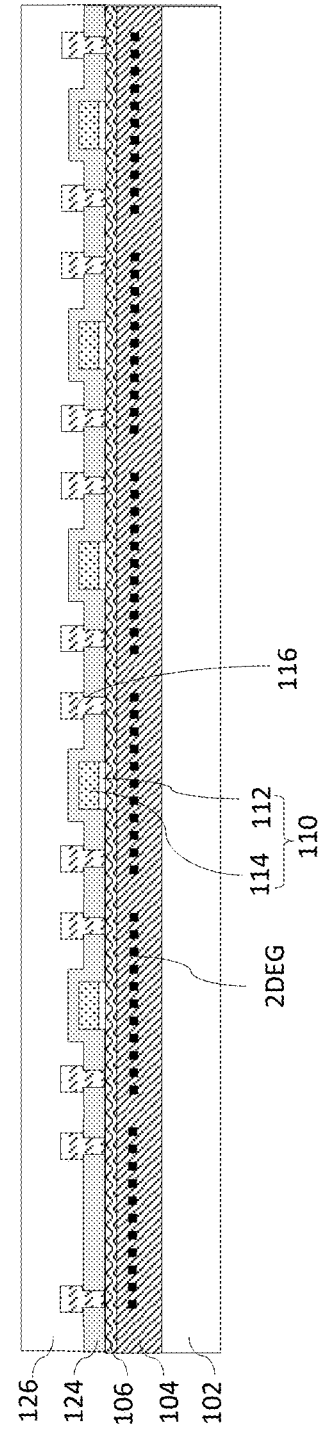

Referring to FIG. 16E, S/D electrodes 116 are formed by patterning the blanket conductive layer 115. Some portions of the blanket conductive layer 115 are removed, and rest of the blanket conductive layer 115 within the S/D regions 160 remains to serve as the S/D electrodes 116. A passivation layer 126 can then be formed on the passivation layer 124 to cover the S/D electrodes 116 by using the above-mentioned deposition techniques.

In some embodiments, the blanket conductive layer 115 may also be patterned to form one or more resistive structures 180 as shown in FIG. 17C at the same step of forming the S/D electrodes 116.

Figure 16F:
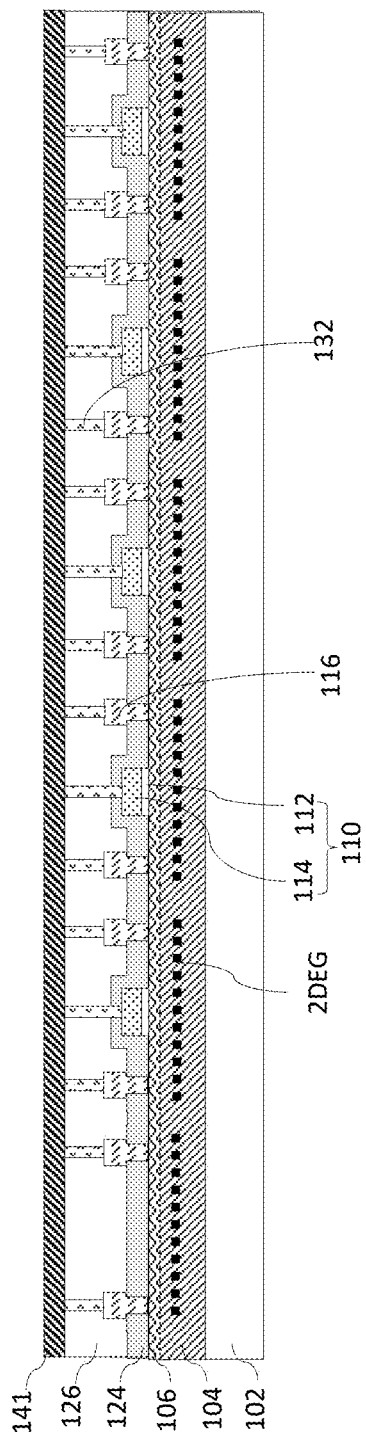

Referring to FIG. 16F, conductive vias 132 are formed to penetrate the passivation layers 126 and 124. A blanket conductive layer 141 is deposited on the passivation layer 126 by using the above-mentioned deposition techniques.

Figure 16G:
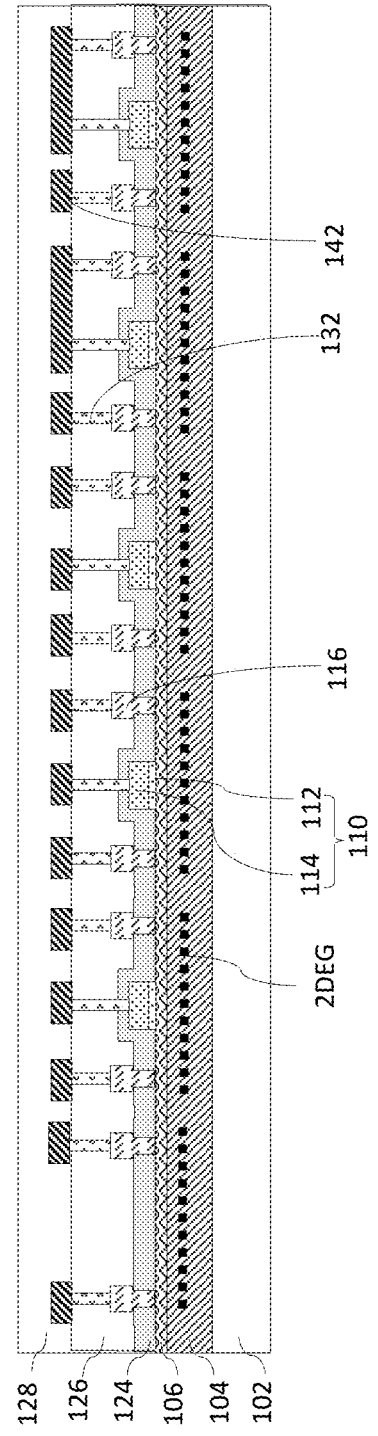

Referring to FIG. 16G, the blanket conductive layer 141 is patterned form conductive lines 142 over the passivation layer 126 and electrically coupled with the conductive vias 132. A passivation layer 128 can then be formed on the passivation layer 126 to cover the conductive lines 142 by using the above-mentioned deposition techniques.

In some embodiments, the blanket conductive layer 141 may also be patterned to form one or more resistive structures 180 as shown in FIG. 17D at the same step of forming the conductive lines 142.

Figure 16H:
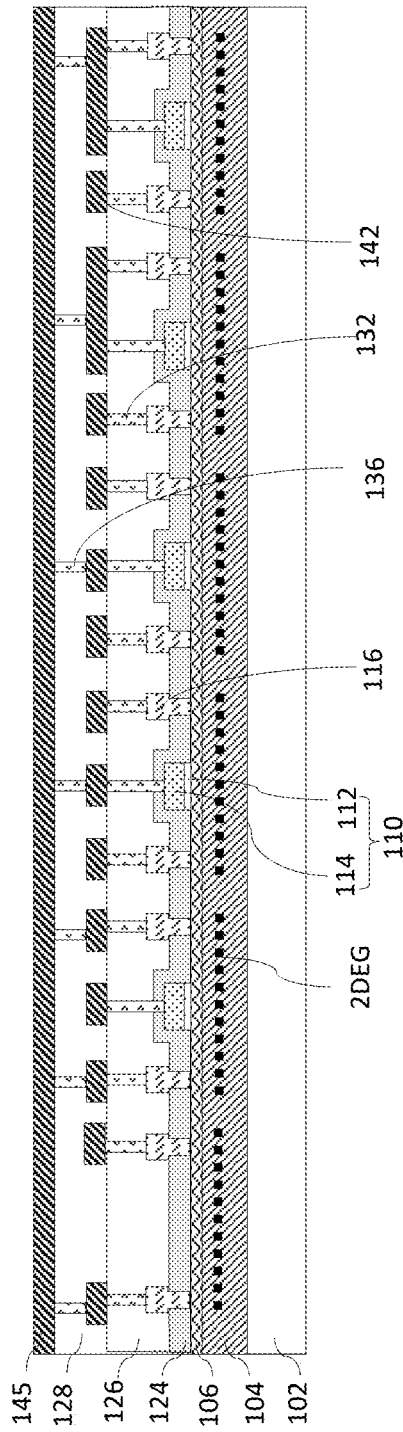

Referring to FIG. 16H, conductive vias 136 are formed in the passivation layer 128. A blanket conductive layer 145 is deposited on the passivation layer 128 by using the above-mentioned deposition techniques.

Figure 16I:
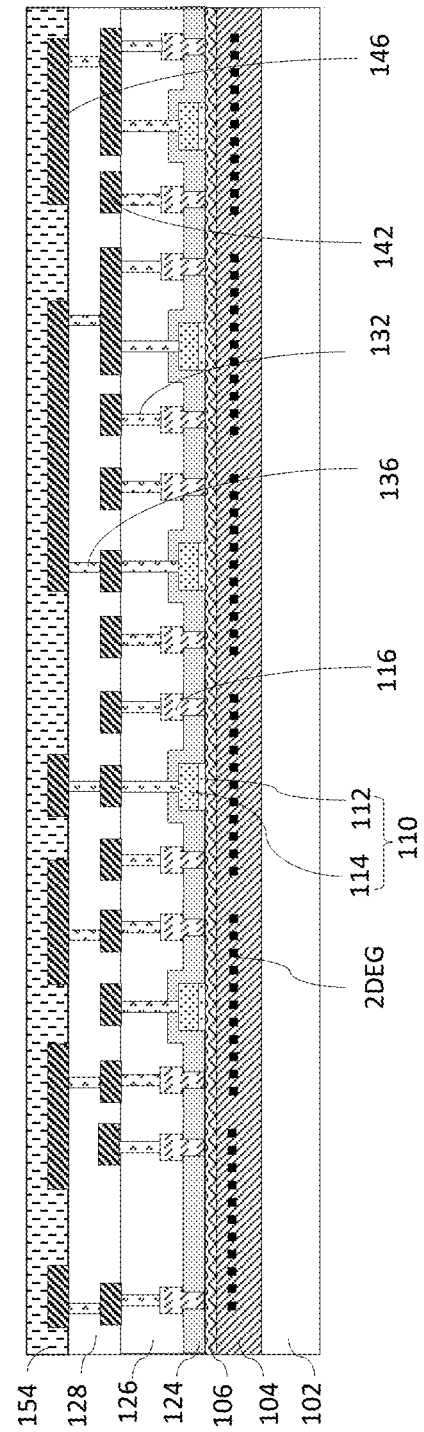

Referring to FIG. 16I, the blanket conductive layer 145 is patterned to form conductive lines 146 over the passivation layer 128 and electrically coupled with the conductive vias 136. A protection layer 154 can then be formed on the passivation layer 128 to cover the conductive lines 146 by using the above-mentioned deposition techniques.

In some embodiments, the blanket conductive layer 145 may also be patterned to form one or more resistive structures 180 as shown in FIG. 17E at the same step of forming the conductive lines 146.

Figure 16J:
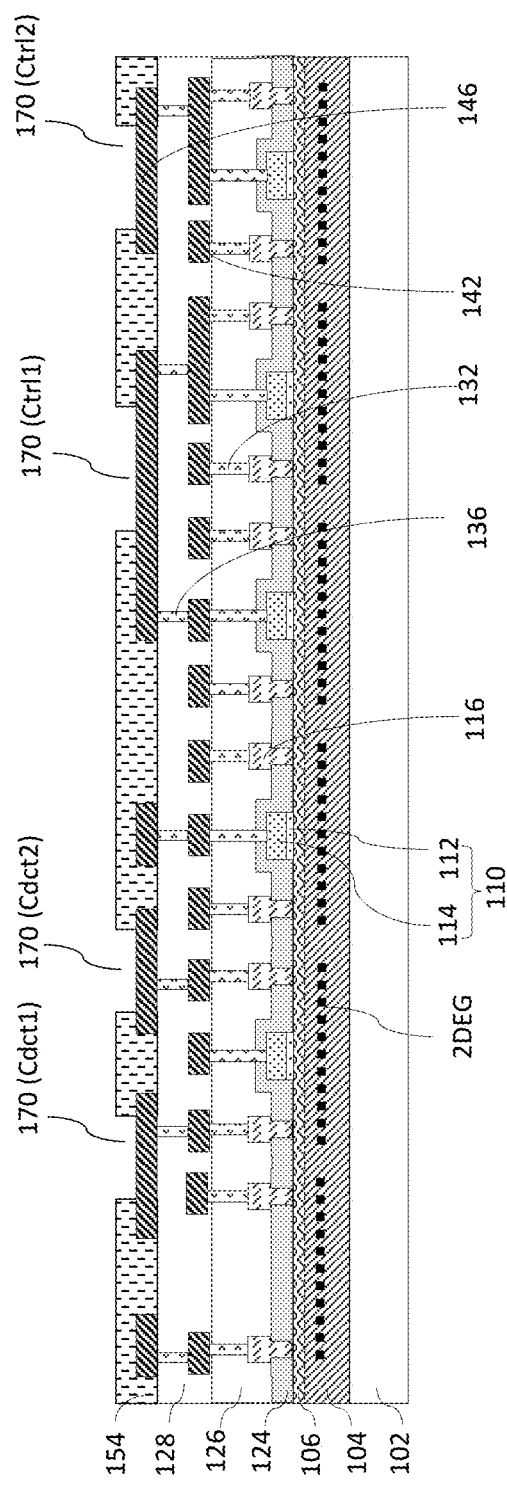

Referring to FIG. 16J, the protection layer 154 can then be patterned to form one or more openings to expose one or more conductive pads 170.

Figure 18:
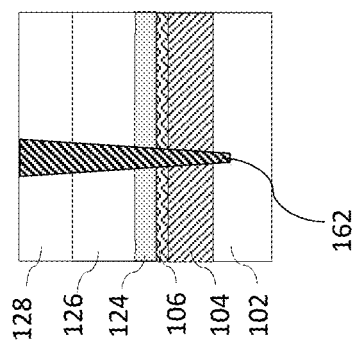
FIG. 18 shows a step of forming a through gallium via (TGV) according to various embodiment of the present invention.

The manufacturing method for the nitride-based IC chip integrated with the circuit 100C/100D/100E/100F is similar to that for the nitride-based IC chip integrated with the circuit 100A/100B, except for that at the stage illustrated in FIG. 16H, a plurality of TGVs 162 may also be formed (as shown in FIG. 18) to extending from a top surface of the passivation layer 128 and penetrating into the substrate 102 before depositing the blanket conductive layer 145.

The embodiments were chosen and described in order to best explain the principles of the invention and its practical application, thereby enabling others skilled in the art to understand the invention for various embodiments and with various modifications that are suited to the particular use contemplated. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. A nitride-based bidirectional switching device for working with a battery protection controller having a power input terminal, a discharge over-current protection (DO) terminal, a charge over-current protection (CO) terminal, a voltage monitoring (VM) terminal and a ground terminal, the nitride-based bidirectional switching device comprising:
   a first control terminal configured for electrically connecting to the DO terminal of the controller and a second control terminal configured for electrically connecting to the CO terminal of the controller;
   a first conduction terminal configured for electrically connecting to the ground terminal of the controller and a second conduction terminal configured for electrically connecting to the VM terminal of the controller through a voltage monitoring resistor;
   a main switching element having a control electrode, a first conduction electrode connected to the first conduction terminal and a second conduction electrode connected to the second conduction terminal; and
   an adaption module configured for receiving a DO signal and a CO signal from the first and second control terminals respectively and generating a main control signal to the control electrode of the main switching element for controlling the main switching element,
   wherein the adaption module comprises:
   a first voltage-clamping element having a positive electrode electrically connected to the first control terminal and a negative electrode electrically connected to a first interconnection node;
   a second voltage-clamping element having a positive electrode electrically connected to the second control terminal and a negative electrode electrically connected to the first interconnection node;

a first auxiliary switching element having a control electrode electrically connected to the first control terminal, a first conduction electrode connected to the first interconnection node and a second conduction electrode connected to a second interconnection node;

a second auxiliary switching element having a control electrode electrically connected to the second control terminal, a first conduction electrode connected to the second interconnection node and a second conduction electrode connected to the control electrode of the main switching element; and a first resistive element having a first electrode electrically connected to the control electrode of the main switching element and a second electrode electrically connected to the first conduction terminal.

2. The nitride-based bidirectional switching device according to claim 1, wherein when a positive high-level voltage is applied to the first control terminal and a positive high-level voltage is applied to the second control terminal, the main switching element is turned on to allow charging/discharging a battery.

3. The nitride-based bidirectional switching device according to claim 1, wherein when a low-level voltage is applied to the first control terminal and a positive high-level voltage is applied to the second control terminal, the main switching element is turned off to protect a battery from over-discharging or short-circuit.

4. The nitride-based bidirectional switching device according to claim 1, wherein when a positive high-level voltage is applied to the first control terminal and a negative high-level voltage is applied to the second control terminal, the main switching element is turned off to protect a battery from over-charging.

5. The nitride-based bidirectional switching device according to claim 1, wherein the main switching element is a first nitride-based transistor having a gate acting as the control electrode of the main switching element, a drain acting as the first conduction electrode of the main switching element and a source acting as the second conduction electrode of the main switching element.

6. The nitride-based bidirectional switching device according to claim 5, wherein the first nitride-based transistor is a AlGaN/GaN enhancement-mode (E-mode) high-electron-mobility transistor (HEMT).

7. The nitride-based bidirectional switching device according to claim 1, wherein:

the first voltage-clamping element is a second nitride-based transistor having a gate and a source being connected together to act as the positive electrode of the first voltage-clamping element and a drain configured to act as the negative electrode of the first voltage-clamping element;

the second voltage-clamping element is a third nitride-based transistor having a gate and a source being connected together to act as the positive electrode of the second voltage-clamping element and a drain configured to act as the negative electrode of the second voltage-clamping element.

8. The nitride-based bidirectional switching device according to claim 1, wherein:

the first auxiliary switching element is a fourth nitride-based transistor having a gate acting as the control electrode of the first auxiliary switching element, a drain acting as the first conduction electrode of the first auxiliary switching element and a source acting as the second conduction electrode of the first auxiliary switching element; and the second auxiliary switching element is a fifth nitride-based transistor having a gate acting as the control electrode of the second auxiliary switching element, a drain acting as the first conduction electrode of the second auxiliary switching element and a source acting as the second conduction electrode of the second auxiliary switching element.

9. The nitride-based bidirectional switching device according to claim 1, wherein the first resistive element is a resistor.

10. The nitride-based bidirectional switching device according to claim 1, wherein the adaption module further comprises a third voltage-clamping element having a positive electrode electrically connected to the control electrode of the main switching element and a negative electrode electrically connected to the second control terminal.

11. The nitride-based bidirectional switching device according to claim 10, wherein:

the third voltage-clamping element is a sixth nitride-based transistor having a gate and a source being connected together to act as the positive electrode of the third voltage-clamping element and a drain configured to act as the negative electrode of the third voltage-clamping element.

12. The nitride-based bidirectional switching device according to claim 1, wherein the main switching element and the adaption module are integrated into a nitride-based integrated circuit (IC) chip.

13. The nitride-based bidirectional switching device according to claim 12, wherein the nitride-based IC chip comprises:

a first nitride-based semiconductor layer disposed above a substrate;

a second nitride-based semiconductor layer disposed on the first nitride-based semiconductor layer and having a bandgap greater than a bandgap of the first nitride-based semiconductor layer;

one or more gate structures formed by patterning a gate semiconductor layer disposed on the second nitride-based semiconductor layer and patterning a gate metal layer disposed on the gate semiconductor layer;

a first passivation layer disposed on the second nitride-based semiconductor layer and covering the gate structures;

one or more source/drain (S/D) electrodes formed by patterning a S/D electrode layer disposed on the first passivation layer and penetrating through the first passivation layer to be in contact with the second nitride-based semiconductor layer;

a second passivation layer disposed on the first passivation layer and covering the S/D electrodes;

one or more first conductive vias disposed within the second passivation layer;

a first conductive layer disposed on the second passivation layer and patterned to form one or more first conductive lines;

a third passivation layer disposed on the first conductive layer and covering the one or more first conductive lines;

one or more second conductive vias disposed within the third passivation layer;

a second conductive layer disposed on the third passivation layer and patterned to form one or more second conductive lines; and a protection layer disposed above the second conductive layer and having one or more openings to expose one or more conductive pads.

14. The nitride-based bidirectional switching device according to claim 13, wherein the nitride-based IC chip further comprises one or more resistive structures formed by patterning a two-dimensional electron gas region adjacent to a heterojunction interface between the first and second nitride-based semiconductor layers.

15. A method for manufacturing a nitride-based bidirectional switching device for working with a battery protection controller having a power input terminal, a discharge over-current protection (DO) terminal, a charge over-current protection (CO) node, a voltage monitoring (VM) terminal and a ground terminal, the method comprising:
    configuring a first control terminal for electrically connecting to the DO terminal of the controller and a second control terminal for electrically connecting to the CO terminal of the controller;
    configuring a first conduction terminal for electrically connecting to the ground terminal of the controller and a second conduction terminal for electrically connecting to the VM terminal of the controller through a voltage monitoring resistor;
    forming a main switching element having a control electrode, a first conduction electrode connected to the first conduction terminal and a second conduction electrode connected to the second conduction terminal; and
    configuring an adaption module for receiving a DO signal and a CO signal from the first and second control terminals respectively and generating a main control signal to the control electrode of the main switching element for controlling the main switching element,
    wherein the adaption module is configured by:
    forming a first voltage-clamping element having a positive electrode electrically connected to the first control terminal and a negative electrode electrically connected to a first interconnection node;
    forming a second voltage-clamping element having a positive electrode electrically connected to the second control terminal and a negative electrode electrically connected to the first interconnection node;
    forming a first auxiliary switching element having a control electrode electrically connected to the first control terminal, a first conduction electrode connected to the first interconnection node and a second conduction electrode connected to a second interconnection node;
    forming a second auxiliary switching element having a control electrode electrically connected to the second control terminal, a first conduction electrode connected to the second interconnection node and a second conduction electrode connected to the control electrode of the main switching element; and
    forming a first resistive element having a first electrode electrically connected to the control electrode of the main switching element and a second electrode electrically connected to the first conduction terminal.

16. The method according to claim 15, wherein the adaption module is configured by further forming a third voltage-clamping element having a positive electrode electrically connected to the control electrode of the main switching element and a negative electrode electrically connected to the second control terminal.

17. The method according to claim 15, further comprising integrating the main switching element and the adaption module into an integrated circuit (IC) chip by:
    disposing a first nitride-based semiconductor layer over a substrate;
    disposing a second nitride-based semiconductor layer on the first nitride-based semiconductor layer, the second nitride-based semiconductor layer having a bandgap greater than a bandgap of the first nitride-based semiconductor layer;
    disposing a gate semiconductor layer on the second nitride-based semiconductor layer and a gate metal layer on the gate semiconductor layer and patterning the gate semiconductor layer and the gate metal layer to form one or more gate structures;
    disposing a first passivation layer on the second nitride-based semiconductor layer to cover the gate structures and patterning the first passivation layer to form one or more source/drain (S/D) regions;
    disposing a S/D electrode layer to cover the first passivation layer and the one or more S/D regions and patterning the S/D electrode layer to form one or more S/D electrodes penetrating through the first passivation layer to be in contact with the second nitride-based semiconductor layer;
    disposing a second passivation layer on the first passivation layer to cover the S/D electrodes;
    disposing a first conductive layer on the second passivation layer and patterning the first conductive layer to form one or more first conductive lines;
    disposing a third passivation layer on the first conductive layer to cover the one or more first conductive lines;
    disposing a second conductive layer on the third passivation layer and patterning the second conductive layer to form one or more second conductive lines;
    disposing a protection layer above the second conductive layer and patterning the protection layer to form one or more openings to expose one or more conductive pads to act as the first control terminal, the second control terminal, the first conduction terminal and second conduction terminal respectively.

18. The method according to claim 17, wherein the integration of the main switching element and the adaption module into the IC chip further comprising patterning a two-dimensional electron gas region adjacent to a heterojunction interface between the first nitride-based semiconductor layer to form one or more resistive structures.

* * * * *